(12) United States Patent
Franck et al.

(10) Patent No.: US 10,270,236 B2
(45) Date of Patent: Apr. 23, 2019

(54) RECESSED EQUIPMENT BOXES AND RELATED ASSEMBLIES AND METHODS

(71) Applicant: WirePath Home Systems, LLC, Charlotte, NC (US)

(72) Inventors: Christopher Glenn Franck, Fort Mill, SC (US); Jamie Lee Quinlan, Charlotte, NC (US); William Jacob Kozlowski, Waxhaw, NC (US)

(73) Assignee: Wirepath Home Systems, LLC, Charlotte, NC (US)

( * ) Notice: Subject to any disclaimer, the term of this patent is extended or adjusted under 35 U.S.C. 154(b) by 322 days.

(21) Appl. No.: 15/046,128

(22) Filed: Feb. 17, 2016

(65) Prior Publication Data

US 2016/0164271 A1   Jun. 9, 2016

Related U.S. Application Data

(63) Continuation-in-part of application No. 13/966,877, filed on Aug. 14, 2013, now Pat. No. 9,370,117.

(60) Provisional application No. 62/140,935, filed on Mar. 31, 2015.

(51) Int. Cl.
| | |
|---|---|
| H05K 5/00 | (2006.01) |
| H02G 3/08 | (2006.01) |
| H03H 7/00 | (2006.01) |
| H02G 3/12 | (2006.01) |
| E04F 19/08 | (2006.01) |

(52) U.S. Cl.
CPC ............ *H02G 3/086* (2013.01); *E04F 19/08* (2013.01); *H02G 3/125* (2013.01); *H03H 7/00* (2013.01); *H02G 3/081* (2013.01); *H05K 5/00* (2013.01)

(58) Field of Classification Search
None
See application file for complete search history.

(56) References Cited

U.S. PATENT DOCUMENTS

| | | | |
|---|---|---|---|
| 4,631,634 A | 12/1986 | Raabe et al. | |
| 4,850,014 A | 7/1989 | Gillis et al. | |
| 5,024,614 A * | 6/1991 | Dola ................... | H02G 3/0431 174/486 |
| 5,274,731 A * | 12/1993 | White .................. | G02B 6/4455 385/134 |
| 5,640,295 A | 6/1997 | Harris et al. | |
| 5,721,667 A | 2/1998 | Rose | |
| RE35,929 E | 10/1998 | Daoud | |
| 7,075,005 B1 | 7/2006 | Drane | |
| 7,109,414 B2 | 9/2006 | Reynolds | |
| 7,119,282 B2 | 10/2006 | Krietzman et al. | |
| 7,362,941 B2 | 4/2008 | Rinderer et al. | |
| 7,589,277 B2 | 9/2009 | Kessler | |
| 7,619,160 B2 | 11/2009 | Grunwald et al. | |

(Continued)

*Primary Examiner* — Courtney L Smith
*Assistant Examiner* — Rashen E Morrison
(74) *Attorney, Agent, or Firm* — Myers Bigel, P.A.

(57) ABSTRACT

An equipment box assembly includes a housing including a back wall, a bottom wall, a top wall, and first and second sidewalls defining a cavity. At least one mounting feature is on each of the first and second sidewalls. The housing is sized to fit between first and second adjacent studs with the first sidewall mounted to the first stud using the at least one mounting feature on the first sidewall and with the second sidewall mounted to the second stud using the at least one mounting feature on the second sidewall.

13 Claims, 34 Drawing Sheets

(56) References Cited

U.S. PATENT DOCUMENTS

| | | | |
|---|---|---|---|
| 7,660,409 B1 * | 2/2010 | Czerwiec | H04M 1/003 |
| | | | 379/325 |
| 7,975,976 B2 | 7/2011 | Wohlford | |
| 8,324,503 B2 | 12/2012 | Pastoriza et al. | |
| 8,355,246 B2 | 1/2013 | Linhares, Jr. et al. | |
| 8,365,936 B2 | 2/2013 | Cox | |
| 8,702,184 B2 * | 4/2014 | Lakoduk | H02B 1/46 |
| | | | 312/222 |
| 9,882,362 B2 * | 1/2018 | Carapella | H02G 3/083 |
| 2002/0139555 A1 | 10/2002 | Dodds et al. | |
| 2006/0278422 A1 | 12/2006 | Drane | |
| 2008/0078133 A1 | 4/2008 | Remmert et al. | |
| 2009/0249705 A1 | 10/2009 | Struthers et al. | |
| 2009/0314907 A1 * | 12/2009 | Romerein | H04M 1/0293 |
| | | | 248/205.1 |
| 2010/0206048 A1 * | 8/2010 | Locke | B66B 11/024 |
| | | | 73/31.03 |
| 2011/0310534 A1 | 12/2011 | Cosley et al. | |
| 2013/0002096 A1 | 1/2013 | Umeki | |
| 2013/0321715 A1 | 12/2013 | Milson et al. | |
| 2014/0160717 A1 | 6/2014 | Malzone et al. | |
| 2015/0096239 A1 | 4/2015 | Frogness | |

\* cited by examiner

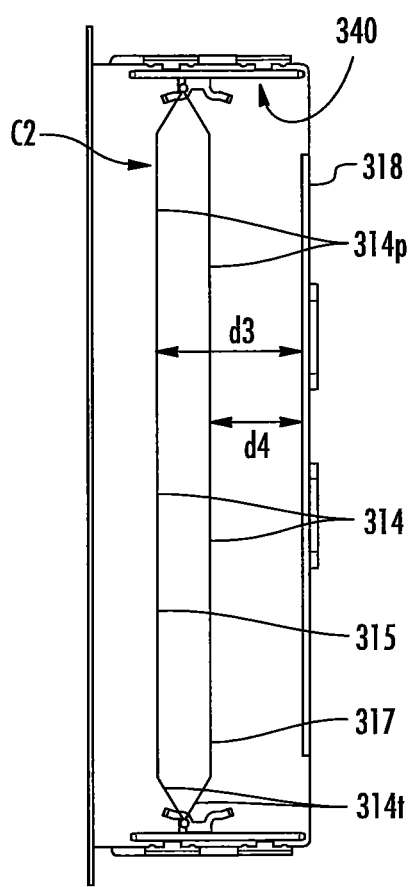
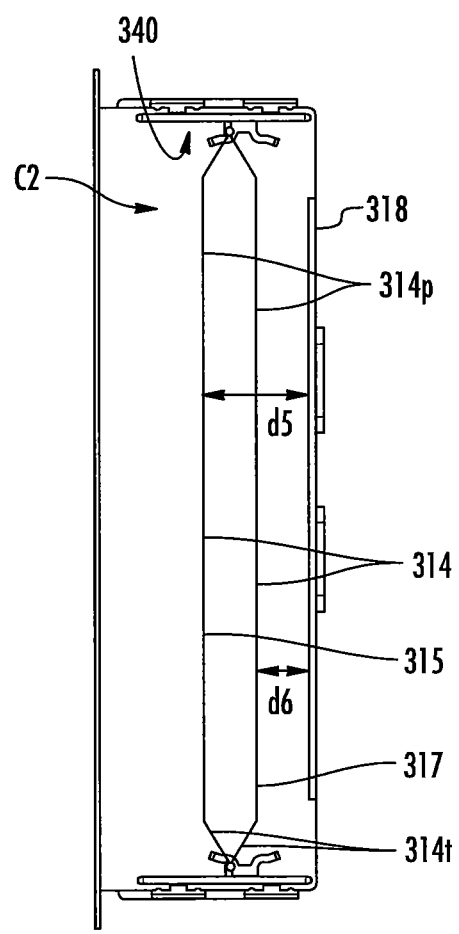
FIG. 31A
FIG. 31B

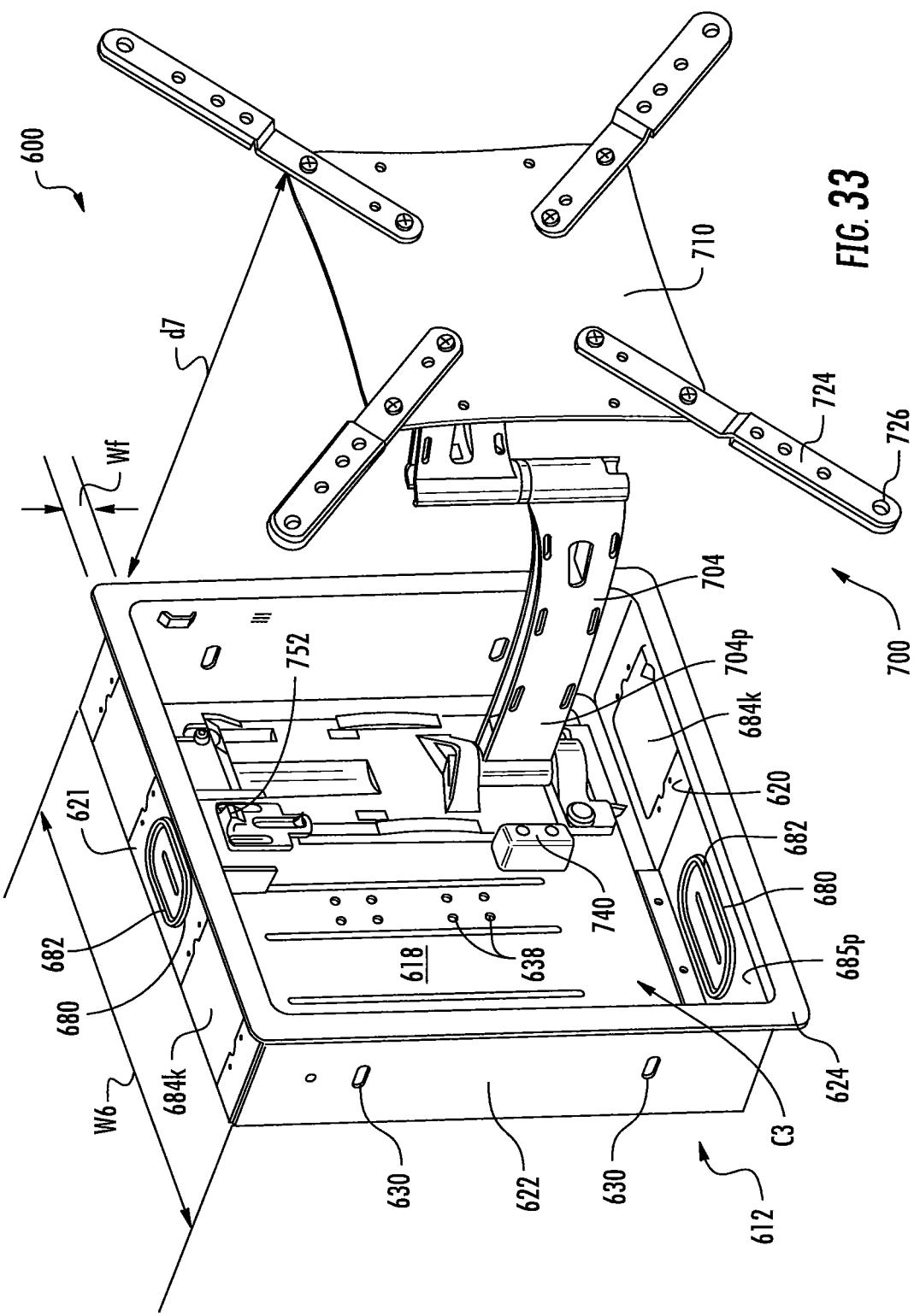

RECESSED EQUIPMENT BOXES AND RELATED ASSEMBLIES AND METHODS

RELATED APPLICATIONS

This application is a continuation-in-part of U.S. application Ser. No. 13/966,877, filed Aug. 14, 2013, and this application also claims priority to U.S. Provisional Application No. 62/140,935, filed Mar. 31, 2015, the disclosure of each of which is incorporated by reference in its entirety.

BACKGROUND

In-wall recessed boxes have been used with flat panel displays or televisions. The recessed boxes are typically positioned behind the flat panel display and may be used for cable and electrical connection, for example. However, known recessed boxes have limited capability and versatility with regard to mounting electronic components and the like that are used with flat panel displays. In addition, complications can arise when installing recessed boxes, for example in pre-construction installations.

SUMMARY

According to a first aspect, embodiments of the invention are directed to an equipment box assembly. The assembly includes an open-ended housing and a support plate. The housing has a back wall and opposed sidewalls defining a cavity in the housing. The back wall includes a plurality of mounting features for mounting electronic components to the back wall. The housing is configured to be positioned in an installed position in a mounting surface such that the cavity is recessed in the mounting surface. The support plate includes a plurality of mounting features for mounting electronic components to the support plate. The support plate is releasably mounted in the housing cavity in a first position with the support plate generally parallel to and spaced apart a first distance from the back wall.

The assembly may include one or more hinge clips mounted to a first sidewall of the housing, with the support plate pivotably coupled to the housing via the one or more hinge clips at the first sidewall. The support plate may be pivotable between the first position and a rotated position with the support plate partially outside the cavity and generally perpendicular to the back wall of the housing. The assembly may include one or more hinge clips mounted to a second sidewall of the housing that is opposite the first sidewall of the housing, with the support plate pivotably coupled to the housing via the one or more hinge clips at the second sidewall. In some embodiments, the hinge clips are releasably mounted to the first and second sidewalls of the housing. In some embodiments the hinge clips are reversible such that each hinge clip is mountable in a first configuration with the support plate releasably mounted in the first position and in a second configuration with the support plate releasably mounted in the housing cavity in a second position with the support plate generally parallel to and spaced apart from the back wall a second distance from the back wall, with the first distance being greater than the second distance.

The mounting features of the housing back wall may include a plurality of apertures and/or a plurality of knockouts, with each knockout configured to be knocked out to provide an aperture. The mounting features of the support plate may include a plurality of apertures.

In some embodiments, the support plate includes a removable section configured to be selectively removed to accommodate an electronic component mounted to the housing back wall. The support plate may include score lines extending toward adjacent transverse edges of the support plate, with the score lines facilitating removal of the removable section.

The housing may include a peripheral flange extending outwardly away from the sidewalls, with the flange configured to rest against the mounting surface in the installed position. The assembly may include a plurality of extendable doglegs or tabs mounted to the housing (for example, at each of third and fourth opposing sidewalls). In the installed position, each dogleg may be extended away from the housing and the mounting surface may be disposed between the flange and the doglegs. In some embodiments, third and fourth opposing sidewalls of the housing each include one or more apertures configured to receive a fastener to mount the housing to adjacent frame members on which the mounting surface is disposed.

In some embodiments, the assembly includes a cover configured to releasably attach to the housing to at least partially enclose the cavity. The cover may include a plurality of tabs and the housing may include a plurality of slots, with each slot configured to receive a corresponding tab when the cover is attached to the housing. Each slot and/or each corresponding tab may include a height adjustment mechanism for adjusting a distance between the housing back wall and the cover that is attached to the housing. The height adjustment mechanism may include a rack provided on the housing slot and a pair of projections defining a groove on the cover tab, with the projections and/or the groove configured to engage the rack for adjusting the distance between the housing back wall and the cover that is attached to the housing.

One or more of the housing sidewalls may include: a knockout configured to be knocked out to expose an opening in the sidewall for mounting an outlet box or a low voltage ring; and/or a cable entry opening. A flexible grommet may be releasably attached to the cable entry opening.

According to a second aspect, embodiments of the invention are directed to a system for installing an equipment box assembly in a wall. The system includes an installation bracket and an equipment box assembly housing. The installation bracket has opposing top and bottom panels and opposing side panels. Each side panel includes one or more bracket mounting apertures for mounting the side panels to adjacent studs in the wall and one or more housing mounting openings. The equipment box assembly housing has opposing top and bottom panels and opposing side panels. Each side panel includes at least one housing aperture. The housing is sized and configured to be positioned within the installation bracket that has been mounted to the studs in the wall. In position, the housing aperture of each housing side panel is aligned with the housing mounting opening of a respective side panel of the bracket such that the housing can be mounted to the studs in the wall.

In some embodiments, an outer surface of each side panel of the installation bracket includes one or more alignment features for positioning the bracket such that a front of the bracket extends outwardly an extended distance from a front of the studs. The one or more alignment features may include indicia on the side panels to indicate the extended distance and/or spaced-apart raised projections that each extend along the side panel the extended distance from the front of the bracket. The extended distance may be about 0.5 inches.

According to a third aspect, embodiments of the invention are directed to a method for installing an equipment box assembly in a wall. The method includes: installing a pre-construction bracket having opposed side panels between a pair of adjacent studs including fastening each side panel of the bracket to a respective one of the studs; inserting an equipment box housing having opposed side panels in the installed pre-construction bracket such that at least one aperture of each side panel of the housing aligns with at least one opening of a respective side panel of the pre-construction bracket; and fastening the equipment box housing to the studs at the aligned apertures and openings.

In some embodiments, the installing step includes installing the pre-construction bracket such that a front of the bracket extends an extended distance in front of the studs. The method may include applying drywall to the studs after the installing step and before the inserting step, with the drywall having a thickness that is substantially the same as the extended distance.

According to a fourth aspect, embodiments of the invention are directed to an equipment box assembly. The assembly includes a housing including a back wall, a bottom wall, a top wall, and first and second sidewalls defining a cavity. Optionally, a plurality of apertures are in the back wall for mounting electronic devices to the back wall. At least one mounting feature is on each of the first and second sidewalls. The housing is sized to fit between first and second adjacent studs (e.g., that are spaced apart 16 inches on center) with the first sidewall mounted to the first stud using the at least one mounting feature on the first sidewall and with the second sidewall mounted to the second stud using the at least one mounting feature on the second sidewall.

In some embodiments, a support plate is releasably held in the housing with at least a major portion of the support plate parallel to and spaced apart from the back wall. The support plate may include a plurality of mounting features for mounting electronic components to the support plate.

In some embodiments, at least one hinge clip is on each of the first and second sidewalls with the support plate releasably held by the hinge clips. The hinge clips and the support plate may be configured such that the support plate can be selectively pivoted at either the at least one hinge clip on the first sidewall or at the at least one hinge clip on the second sidewall.

In some embodiments, the support plate includes: a primary plate portion having first and second opposite sides; and at least one tab at each of opposing edges of the primary plate portion, with each tab extending away from the primary plate portion at an angle, wherein the tabs are releasably held by the hinge clips.

In some embodiments, the hinge clips and the support plate are configured such that the support plate can be selectively positioned in the housing cavity: in a first position with the first side of the primary plate portion facing the back wall of the housing and the primary plate portion spaced apart from the back wall a first distance; and in a second position with the second side of the primary plate portion facing the back wall of the housing and the primary plate portion spaced apart from the back wall a second distance that is less than the first distance. In some embodiments, the hinge clips and the support plate are configured such that the support plate can be selectively positioned in the housing cavity: in a third position with the first side of the primary plate portion facing the back wall of the housing and the primary plate portion spaced apart from the back wall a third distance that is less than the second distance; and in a fourth position with the second side of the primary plate portion facing the back wall of the housing and the primary plate portion spaced apart from the back wall a fourth distance that is less than the third distance.

Each hinge clip may include a clip member, and the hinge clips may be configured to be reversibly mounted to the first and second sidewalls in a first configuration and a second configuration, with the clip member being closer to the housing back wall in the second configuration than in the first configuration. The hinge clips may be in the first configuration with the support plate in the first and second positions and in the second configuration with the support plate in the third and fourth positions.

In some embodiments, the support plate is releasably held in the housing at two locations on the first sidewall and at two locations on the second sidewall.

In some embodiments, a plurality of apertures are in the back wall for mounting electronic components to the back wall.

In some embodiments, a removable panel is on the bottom wall of the housing, the removable panel configured to be removed to expose an opening sized and configured to receive a power conditioner with the power conditioner held at the bottom wall of the housing. The equipment box assembly may be in combination with a power conditioner including a housing having a front surface. A major portion of the power conditioner housing may be received through the opening and the power conditioner may be held in the housing with the front surface of the power conditioner housing adjacent the bottom wall of the equipment box housing. At least one bracket may be on the power conditioner housing and connected to at least one of the back wall and the bottom wall of the equipment box housing.

In some embodiments, a display mount assembly is connected to the back wall of the housing. The display mount assembly may include: first articulating arm member operatively connected to the back wall of the housing; a second articulating arm member pivotally connected to the first arm member; and an adapter plate operatively connected to the second arm member. The display mount assembly may be movable between an extended position with the adapter plate spaced apart from a front of the housing and a collapsed position with the first and second articulating arm members in the housing cavity and the adapter plate member adjacent the front of the housing.

The housing may include a peripheral flange extending outwardly away from the bottom wall, the top wall and the first and second sidewalls, and, with the display mount assembly in the collapsed position, the adapter plate may be substantially coplanar with the flange. An arm stop member may extend away from the back wall of the housing, and the first articulating arm member may abut the arm stop member with the display mount assembly in the collapsed position. A first latch feature may be on the back wall of the housing and a second latch feature may be on the display mount assembly, and the first and second latch features may engage one another with the display mount assembly in the collapsed position and may retain the display mount assembly in the collapsed position.

According to a fifth aspect, embodiments of the invention are directed to an equipment box and power conditioner assembly. The assembly includes a housing including a back wall, a bottom wall, a top wall, and first and second sidewalls defining a cavity and a power conditioner. An opening is in the bottom wall of the housing, and the opening and the power conditioner are sized and configured such that the power conditioner can be received through the opening and held at the bottom wall of the housing in an installed position. At least one mounting feature is on each of the first and second sidewalls. The housing is sized to fit between first and second adjacent studs with the first sidewall mounted to the first stud using the at least one mounting feature on the first sidewall and with the second sidewall mounted to the second stud using the at least one mounting feature on the second sidewall.

In some embodiments, a removable panel is on the bottom wall of the housing, with the removable panel configured to be removed to expose the opening in the bottom wall of the housing.

In some embodiments, the power conditioner includes a housing having a bottom surface, a top surface and a front surface. The assembly may include a first bracket attached to the bottom surface of the housing and a second bracket attached to a top surface of the power conditioner. The first bracket may be connectable to one of the back and bottom walls of the equipment box housing and the second bracket may be connectable to the other one of the back and bottom walls of the equipment box housing in the installed position.

In some embodiments, the power conditioner includes a housing having a front surface, and a major portion of the power conditioner housing extends through the opening and below the bottom wall of the equipment box housing and the front surface of the power conditioner housing is adjacent the bottom wall of the equipment box housing in the installed position.

According to a sixth aspect, embodiments of the invention are directed to an equipment box and display mount assembly including: a housing comprising a back wall, a bottom wall, a top wall, and first and second sidewalls defining a cavity in the housing; a plurality of apertures in the back wall for mounting electronic devices to the back wall; and a display mount assembly connected to the back wall of the housing. The display mount assembly includes: a first articulating arm member operatively connected to the back wall of the housing; a second articulating arm member pivotally connected to the first articulating arm; and an adapter plate operatively connected to the second arm member, with the adapter plate configured to receive and hold a display device thereon. The display mount assembly is movable between an extended position with the adapter plate spaced apart from a front of the housing and a collapsed position with the first and second articulating arm members in the housing cavity and the adapter plate member adjacent the front of the housing. The housing is sized to fit between first and second adjacent studs with the first sidewall mounted to the first stud using at least one mounting feature on the first sidewall and with the second sidewall mounted to the second stud using at least one mounting feature on the second sidewall.

In some embodiments, the housing comprises a peripheral flange extending outwardly away from the bottom wall, the top wall and the first and second sidewalls. With the display mount assembly in the collapsed position, the adapter plate may be substantially coplanar with the flange.

In some embodiments, an arm stop member extends away from the back wall of the housing. The first articulating arm member may abut the arm stop member with the display mount assembly in the collapsed position.

In some embodiments, a first latch feature is on the back wall of the housing and a second latch feature is on the display mount assembly. The first and second latch features may engage one another with the display mount assembly in the collapsed position and retain the display mount assembly in the collapsed position.

BRIEF DESCRIPTION OF THE DRAWINGS

FIG. 31A is a sectional view of the housing and the support plate of FIG. 19, with the hinge clip in the first configuration of FIG. 30, and with the support plate mounted in first and second positions in the housing.

FIG. 31B is a sectional view of the housing and the support plate of FIG. 19, with the hinge clip in the second configuration of FIG. 30, and with the support plate mounted in third and fourth positions in the housing.

FIG. 33 is a front perspective view of an equipment box and display mount assembly including a housing and a display mount assembly, with the display mount assembly in a fully extended position, according to some other embodiments.

Figure 1:
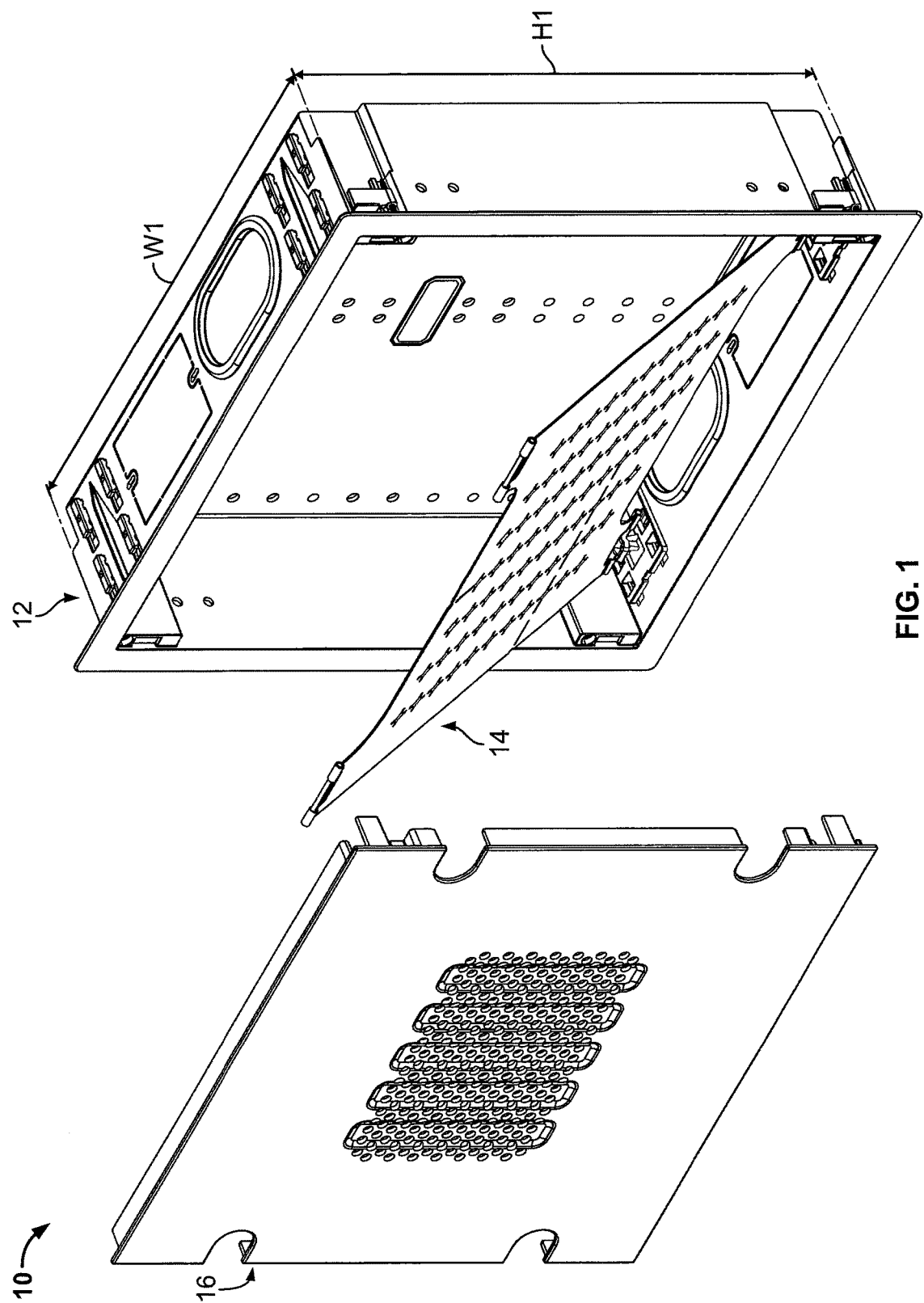
FIG. 1 is a partially exploded perspective view of an equipment box assembly including a housing, a support plate and a cover according to some embodiments.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION OF EMBODIMENTS OF THE INVENTION

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

It is noted that any one or more aspects or features described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

Generally speaking, embodiments of the invention are directed to equipment boxes and related assemblies that are configured to be mounted (recessed) in a mounting surface such as a ceiling or a wall. The equipment boxes and related assemblies may be installed in existing ceilings or walls, or may be installed in "new jobs," for example using an optional installation or pre-construction bracket.

An equipment box assembly 10 is shown in FIG. 1. The assembly 10 includes a housing 12, a support plate 14 and a cover 16. The support plate 14 may be releasably and/or pivotably held in the housing 12 and the cover 16 may be positioned (e.g., adjustably positioned) over an opening of the housing 12, as will be described in greater detail below.

Figure 2:
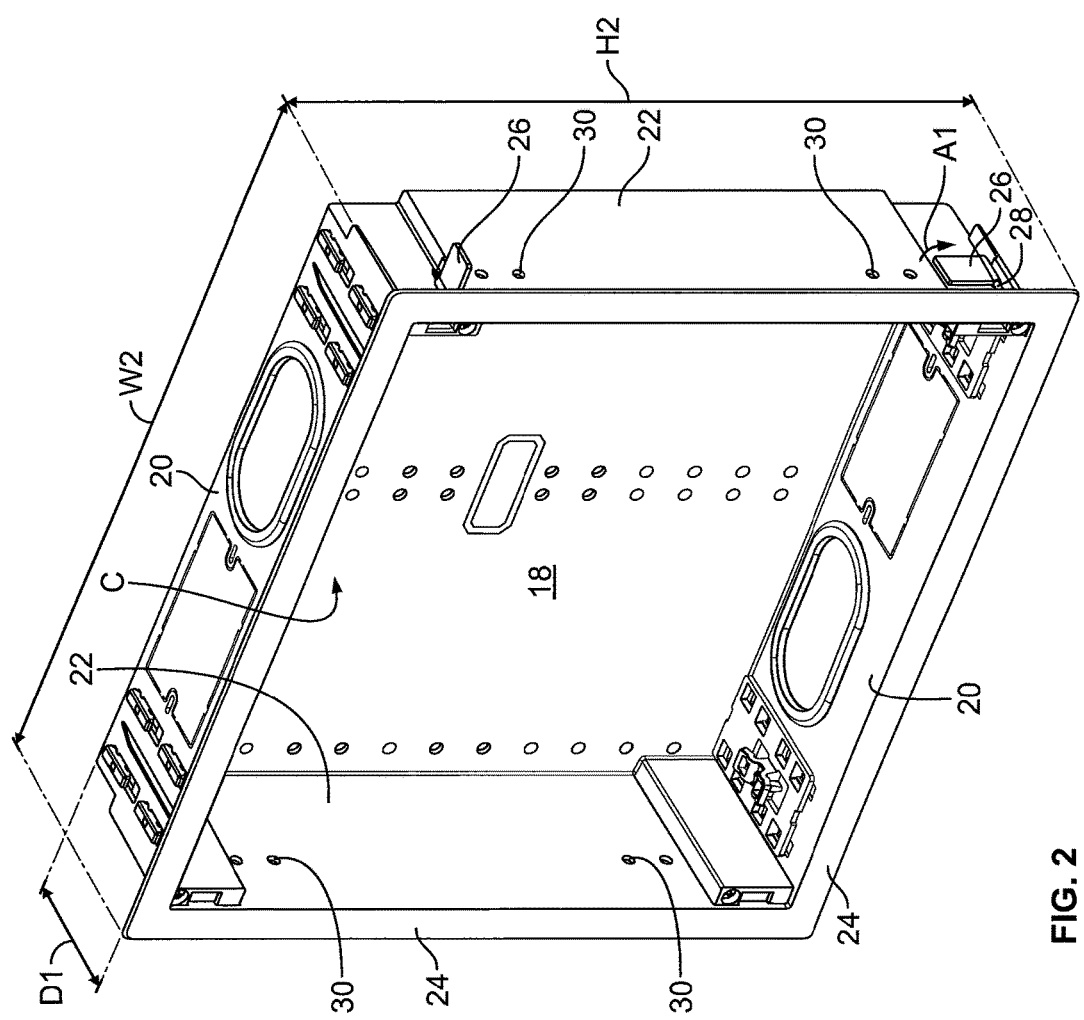
FIG. 2 is a perspective view of the housing of FIG. 1.
Figure 3:
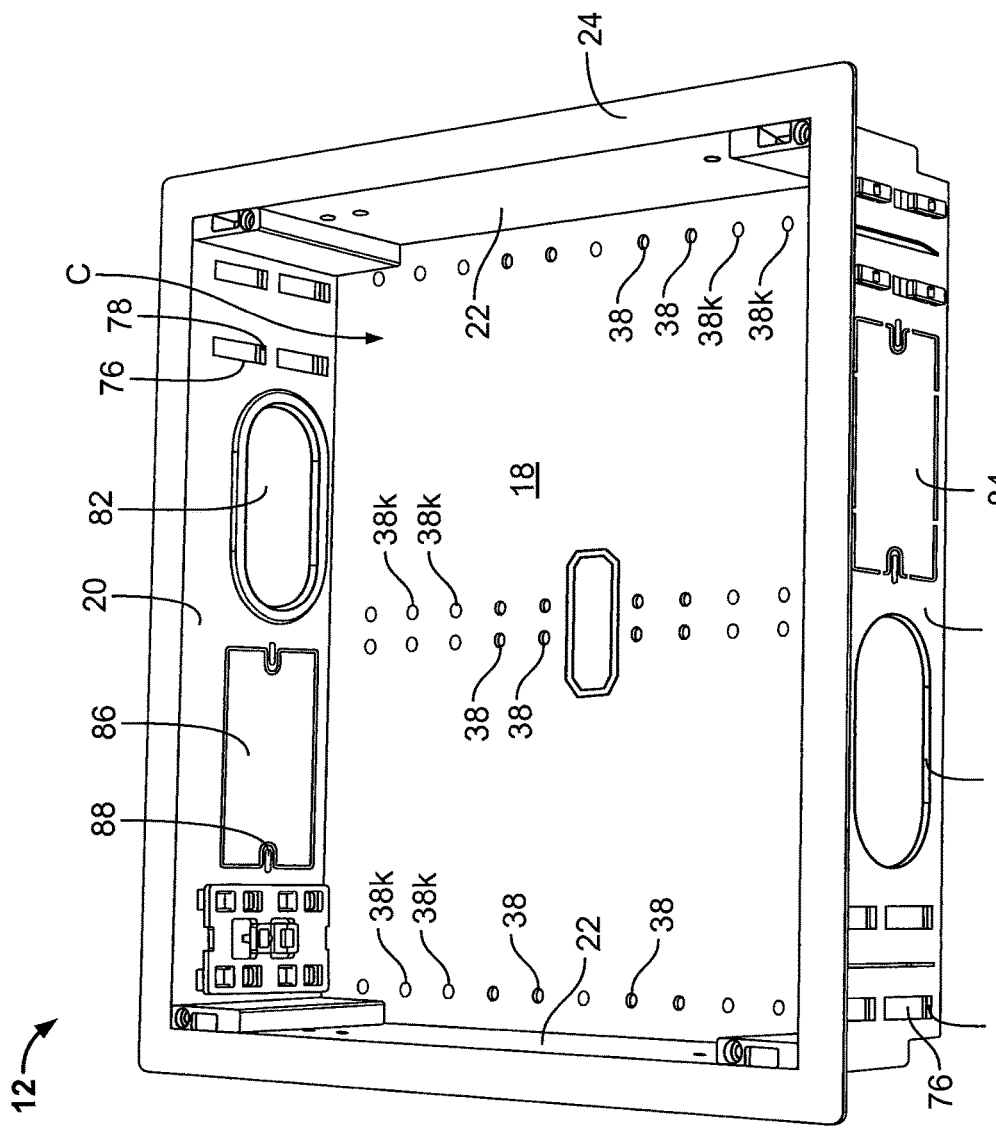
FIG. 3 is a top perspective view of the housing of FIG. 1.

Turning to FIGS. 2 and 3, the housing 12 includes a back panel or wall 18 and a plurality of side panels or sidewalls that extend outwardly or upwardly away from an outer periphery of the back wall 18. The sidewalls include a pair of opposed sidewalls 20 and a pair of opposed sidewalls 22. The back wall 18 and the sidewalls 20, 22 define an open cavity C in the housing 12. As illustrated, the housing 12 takes the form of an open-ended box.

The housing 12 may include a variety of mounting features for mounting or recessing the housing 12 in a mounting surface. As illustrated, a peripheral flange 24 extends outwardly at distal ends of the sidewalls 20, 22. A plurality of doglegs or tabs 26 are coupled to the housing 12 by fasteners 28 (e.g., a screw or other threaded fastener). As indicated by the arrow A1 in FIG. 2, each dogleg 26 is configured to be moved from a retracted position with the dogleg 26 generally parallel to one of the sidewalls 22 to an extended position with the dogleg 26 generally perpendicular to the sidewall 22. Each dogleg 26 may be moved between the retracted and extended positions by manipulating its associated fastener 28. Each dogleg 26 may also be advanced toward the flange 24 and away from the flange 24 by manipulating the fastener 28. Each sidewall 22 also includes a plurality of apertures 30 extending therethrough.

Figure 4:
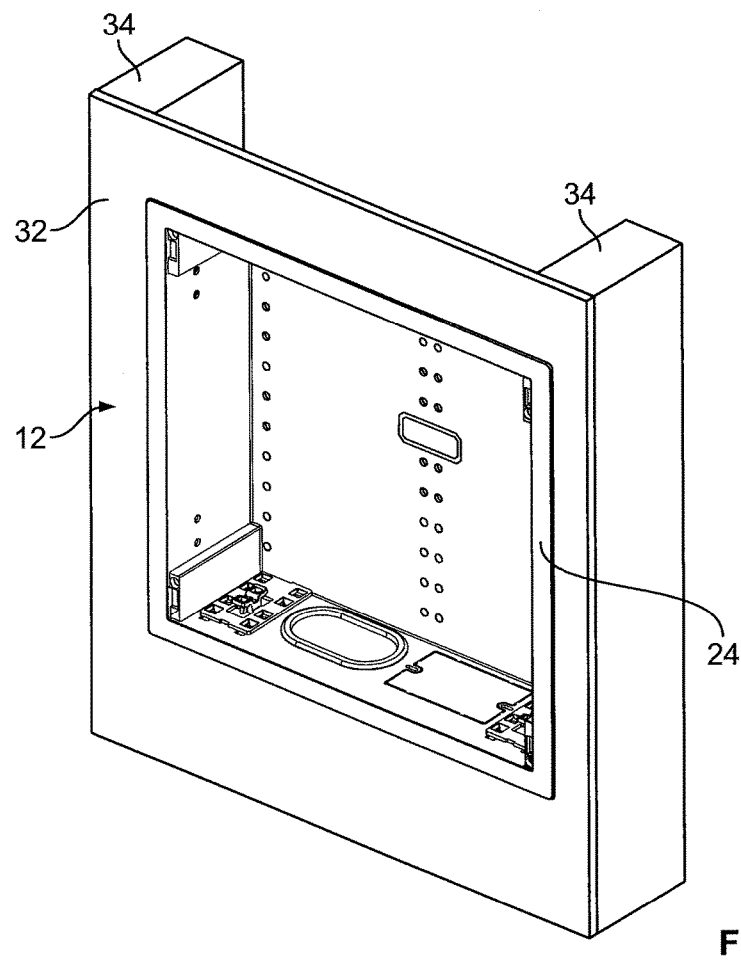
FIG. 4 is a perspective view of the housing of FIG. 1 installed in a mounting surface.
Figure 5:
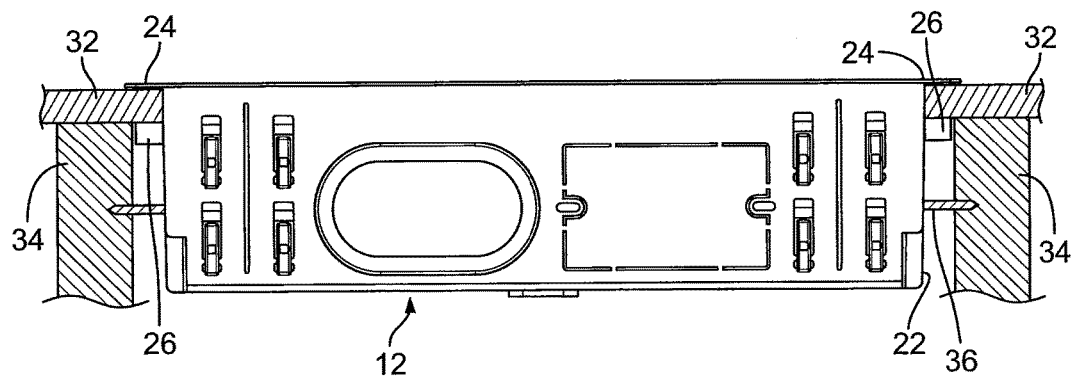
FIG. 5 is an end view of the housing of FIG. 1 installed in a mounting surface.

As illustrated in FIGS. 4 and 5, the housing 12 may be positioned in an installed position against a mounting surface 32, such as a ceiling or a wall. The mounting surface 32 may be drywall, sheetrock, plaster or the like and may be disposed on frame members 34, such as joists or studs. The housing 12 is sized to fit between adjacent frame members 34 with the housing flange 24 flush against the mounting surface 32. For example, the housing 12 may be sized to fit between studs that are 16 inches on center.

The doglegs 26 may be moved to the extended position and advanced toward the flange 24 such that the mounting surface 32 is captured between the flange 24 and the doglegs 26. As shown in FIG. 5, fasteners 36 (e.g., a screw or other threaded fastener) may be received through the apertures 30 in the housing sidewalls 22 (FIG. 2) and advanced into the frame members 34. One or more of the fasteners 36 may be employed if any of the doglegs 26 will not extend due to insufficient clearance between the frame members 34, for example.

Referring again to FIG. 3, a plurality of mounting features may be provided on the back wall 18 of the housing 12 for mounting items such as electronic components to the back wall 18. As illustrated, the mounting features may include apertures 38 formed through the back wall 18. The back wall 18 may also include a plurality of small knockouts 38k that are configured to be knocked out or removed to provide additional apertures as needed. Clips, hooks, hook and loop fasteners, straps and other mounting features known to those of skill in the art may also be employed.

The housing 12 may be formed of any suitable material. In some embodiments, the housing 12 is metal; in other embodiments, the housing is formed of a polymer. In some embodiments, the housing 12 is formed of acrylonitrile butadiene styrene (ABS).

The housing 12 may be generally rectangular or square. Referring to FIG. 1, the housing 12 excluding the flange 24 may have a height H1 of between about 11 and 15 inches, between about 12 and 14 inches, and about 13.25 inches in various embodiments. The housing 12 excluding the flange 24 may have a width W1 of between about 13 and 15 inches, between about 13.5 and 14.5 inches, and about 14 inches in various embodiments. Referring to FIG. 2, the housing 12 including the flange 24 may have a height H2 of between about 12 and 16 inches, between about 13.5 and 15.5 inches, and about 14.5 inches in various embodiments. The housing 12 including the flange 24 may have a width W2 of between about 14 and 16 inches, between about 15 and 16 inches, and about 15.25 inches in various embodiments. In various embodiments, the housing 12 may have a depth D1 of between about 2 and 6 inches, between about 3 and 5 inches, and about 3.8 inches.

Figure 6:
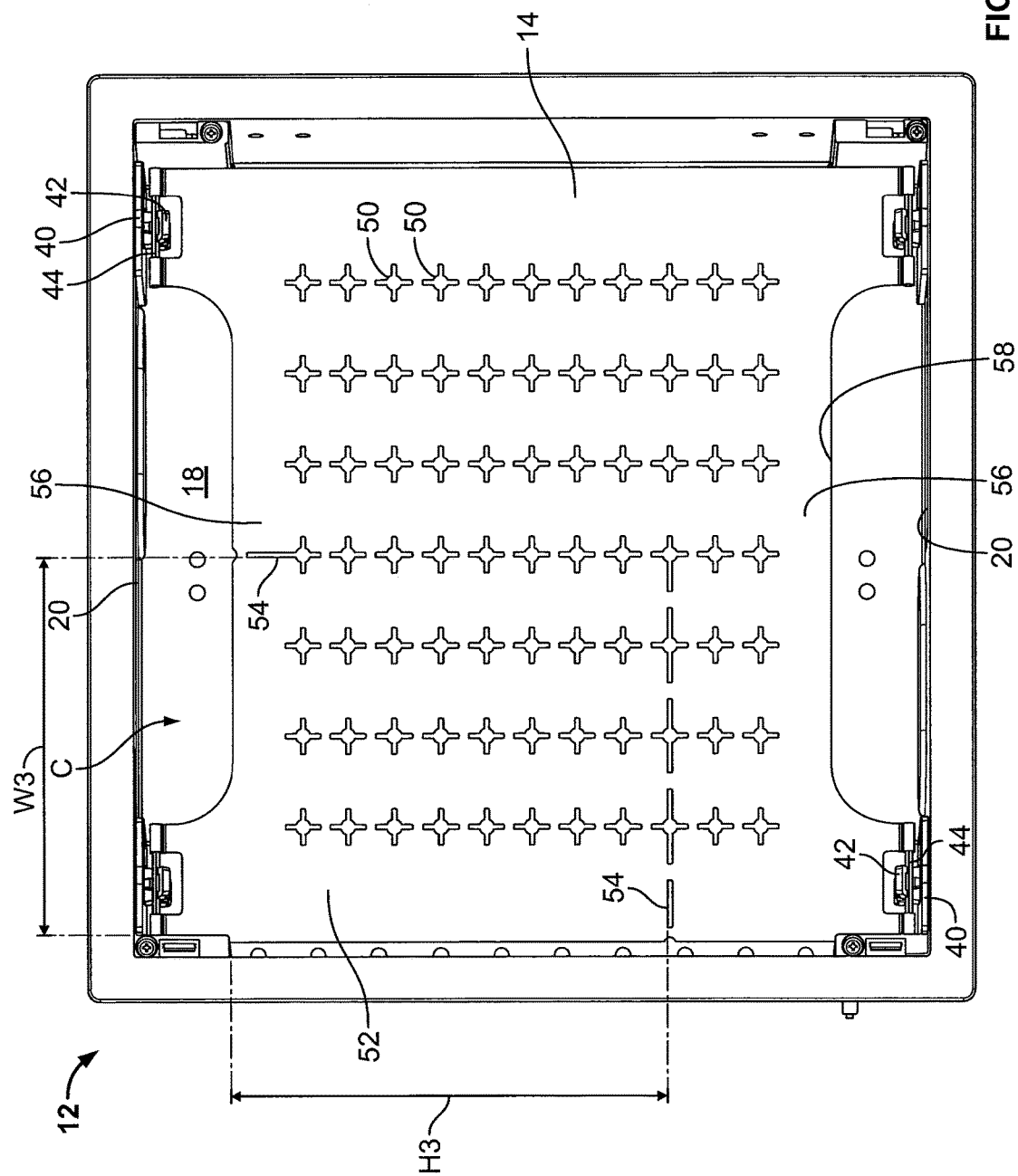
FIG. 6 is a front view of the housing and support plate of FIG. 1.

Turning now to FIG. 6, the support plate 14 is shown releasably mounted in the cavity C of the housing 12. As illustrated, two hinge brackets or hinge clips 40 are attached to each sidewall 20 in a spaced-apart relationship. Each hinge bracket 40 includes a clip member 42 that is configured to receive and releasably hold a pivot bar 44 of the support plate 14. The hinge brackets 40 are configured to hold the support plate 14 spaced apart from the back wall 18 of the housing 12 with the support plate 14 generally parallel to the back wall 18. The support plate 14 allows for two layers of components or equipment to be mounted in the housing 12, as will be discussed in more detail below.

The support plate 14 includes a plurality of apertures or perforations 50 extending therethrough. The apertures 50 are for mounting items such as electronic equipment and/or for cable or wire management. In some embodiments, and as illustrated, the apertures 50 may include a center opening and a plurality of elongated slots extending away from the center opening. Clips, hooks, hook and loop fasteners, straps and other mounting features known to those of skill in the art may also be employed in addition to or instead of the apertures 50.

The support plate 14 may include a removable section 52. Score lines 54 extend to or near adjacent transverse edges of the support plate 14 to facilitate removal of the removable section 52. The removable section 52 may be removed using a tool (e.g., tin snips) and/or by bending (e.g., fatiguing) the support plate 14 at the score lines 54. Removal of the removable section 52 may be desirable when a relatively large (deep) electronic component is mounted to the back wall 18 of the housing 12.

The support plate 14 is sized and shaped to fit within a major portion of the housing cavity C. The removable section 52 may have a height H3 of about 7 inches and a width W3 of about 6.5 inches. The removable section 52 may be sized differently, and additional portions of the support plate 14 may be selectively removed as needed, for example using tin snips.

Opposing edge portions 56 of the support plate 14 include recesses or valleys 58 that extend inwardly toward the center of the support plate 14. The recesses 58 may facilitate cable management. The recesses 58 may also allow a user to grip the support plate to insert, remove and/or pivot the support plate 14 with respect to the hinge clips 40.

The support plate 24 may be formed of any suitable material. In some embodiments, the support plate 24 is metal; in other embodiments, the support plate is formed of a polymer. In some embodiments, the support plate 24 comprises aluminum or steel.

Figure 7:
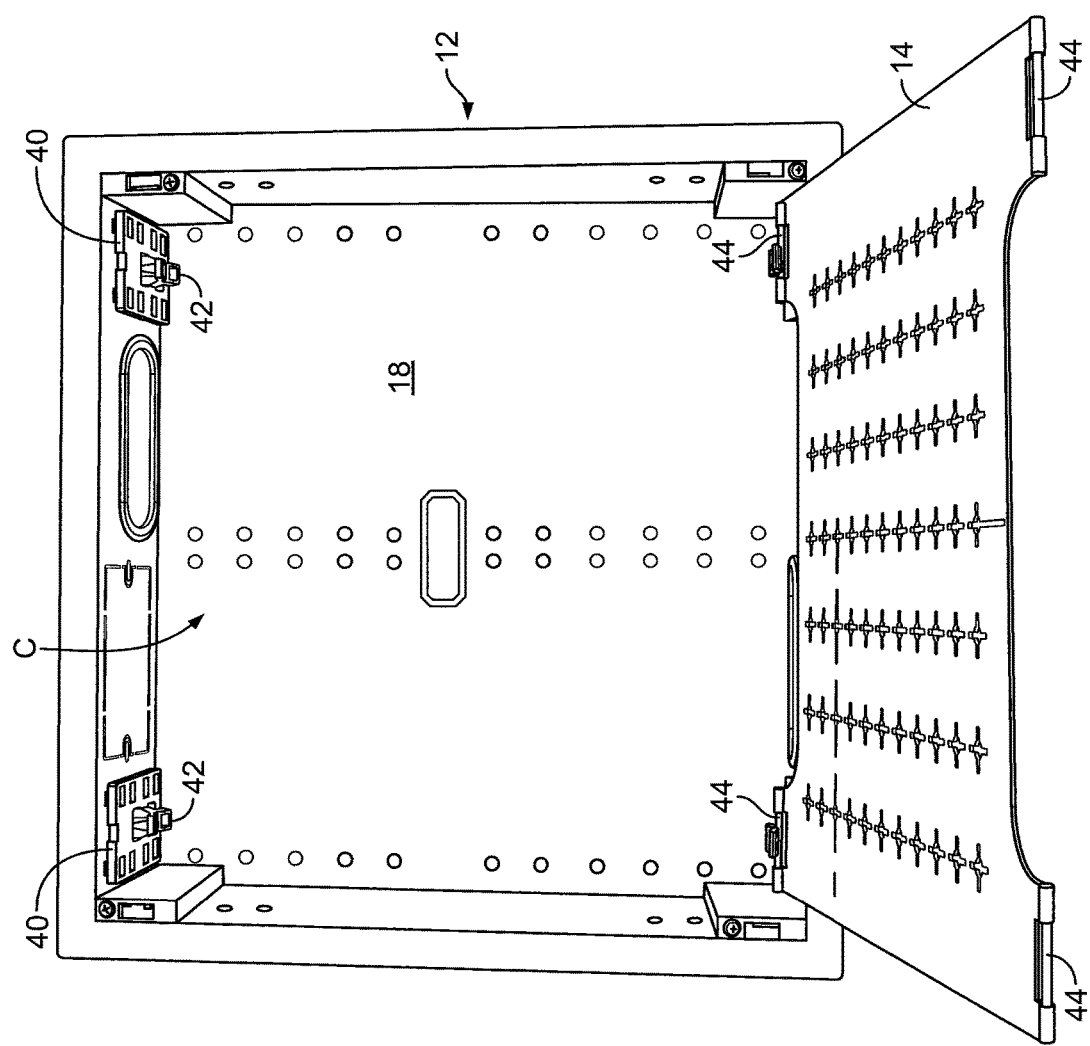
FIG. 7 is a front view of the housing and support plate of FIG. 6 with the support plate in a pivoted position.

As shown in FIG. 7, the support plate 14 may be pivotably coupled to the hinge clips 40 such that the support plate 14 may be disengaged from one pair of the hinge clips 40 and pivoted at the other pair of the hinge clips 40. Specifically, each of a pair of support plate pivot bars 44 may be disengaged with its associated hinge clip member 42 and the support plate may be pivoted about an axis defined by the other pair of the support plate pivot bars 44. In some embodiments, the support plate 14 is pivotable between a first position with the support plate 14 in the cavity C and generally parallel to and spaced apart from the housing back wall 18 (e.g., FIG. 6) and a second position with the support plate 14 partially outside the cavity C and generally perpendicular to the housing back wall 18 (e.g., FIG. 7). It will be appreciated that the support plate 14 may be pivoted in an opposite direction to that shown in FIG. 7; that is, the support plate 14 may be pivotably held by the other pair of hinge clips 40 and pivoted about an axis defined by the other pair of support plate pivot bars 44.

Figure 8:
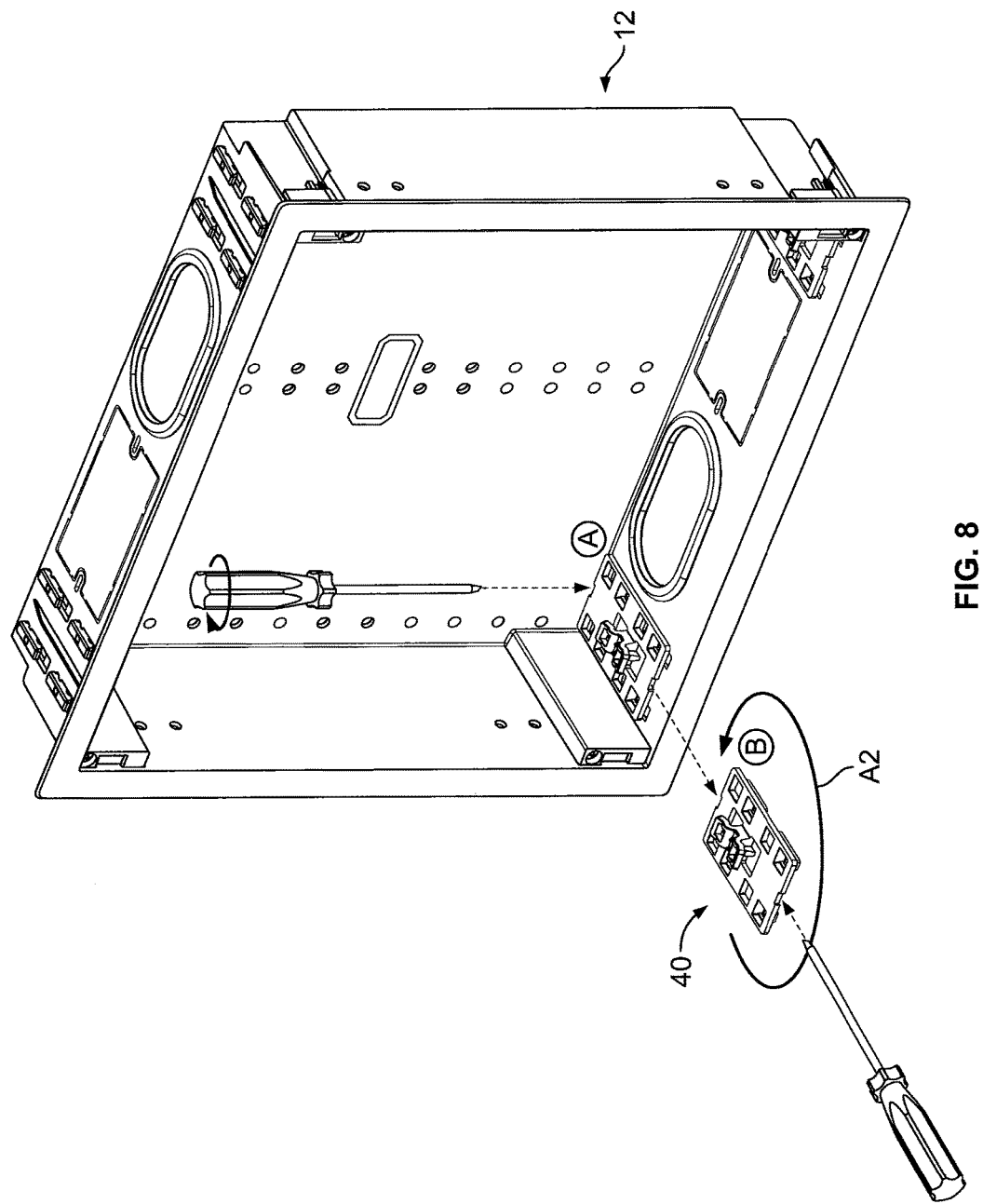
FIG. 8 is a perspective view of the housing of FIG. 1 illustrating a hinge clip that may be releasably mounted to the housing in first and second configurations according to some embodiments.
Figure 10B:
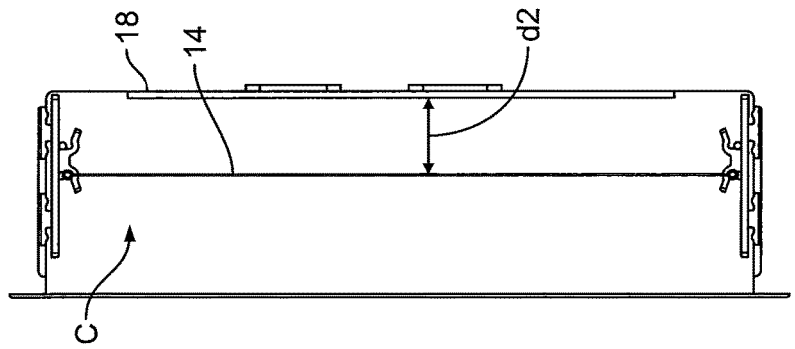
FIGS. 10A and 10B are side views of the housing and the support plate of FIG. 1, with the support plate mounted in first and second positions corresponding to the first and second configurations of the hinge clip of FIG. 8.
Figure 10A:
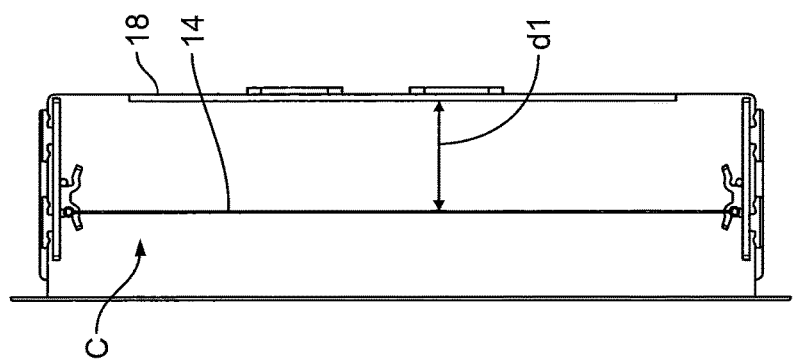
Figure 9:
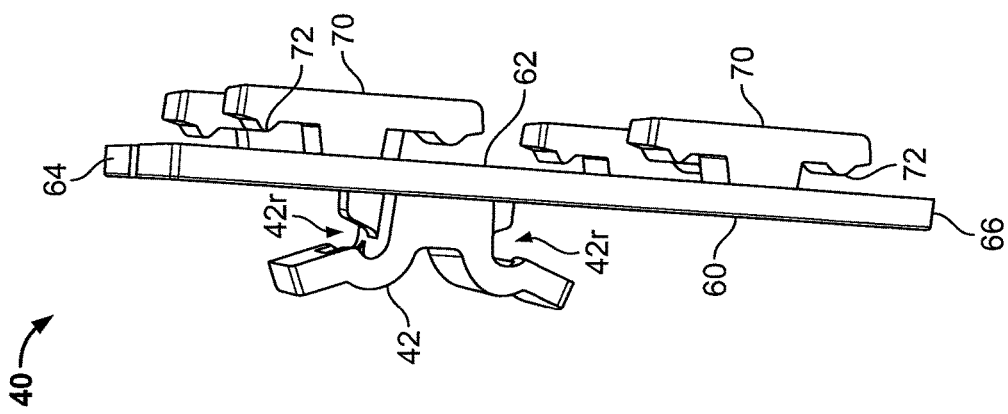
FIG. 9 is a side view of the hinge clip of FIG. 8.

Turning to FIGS. 8-10, each hinge clip 40 may be reversible for additional installation options. Each hinge clip 40 may be releasably mounted to the housing 12 in a first configuration A shown in FIG. 8, removed from the housing 12, rotated 180 degrees as shown by the arrow A2 to a second configuration B, and reinserted or releasably mounted to the housing 12 in the second configuration B. With the hinge clips 40 in the first configuration, the support plate 14 may be held in a first position in the housing cavity C with the support plate 14 generally parallel to and spaced apart a first distance d1 from the housing back wall 18 (FIG. 10A). With the hinge clips 40 in the second configuration, the support plate 14 may be held in a second position in the housing cavity C with the support plate 14 generally parallel to and spaced apart a second distance d2 from the housing back wall 18 (FIG. 10B). As illustrated, the first distance d1 is greater than the second distance d2. In some embodiments, the first distance d1 is about 2 inches and the second distance d2 is about 1.4 inches.

One of the hinge clips 40 is shown in greater detail in FIG. 9. The hinge clip 40 includes opposing faces 60, 62 and opposite ends 64, 66. The clip member 42 is provided on the face 60 and includes a pair of receiving pockets or portions 42r, with one of the receiving pockets 42r configured to receive one of the support plate pivot bars 44 when the hinge clip 40 is in the first configuration, and with the other one of the receiving pockets 42r configured to receive the pivot bar 44 when the hinge clip 40 is in the second configuration. The clip member 42 is positioned closer to the end 64 than the end 66 such that the support plate 14 will be spaced apart a different distance from the housing back wall 18 when the hinge clips 40 are in the different configurations (e.g., the distances d1 and d2 shown in FIGS. 10A and 10B).

A plurality of tabs 70 are provided on the opposite face 62 of the hinge clip 40. As illustrated, each tab 70 includes a pair of projections 72. Referring back to FIG. 3, the housing may include a plurality of elongated slots 76 and adjacent apertures or openings 78. The hinge clip 40 may be releasably (and reversibly) mounted to the housing such that each tab 70 is received in one of the slots 76 and one of the projections 72 is received in an adjacent opening 78.

Still referring to FIG. 3, the housing 12 may include one or more cable entry ports 80. As illustrated, each sidewall 20 includes a cable entry port 80. A grommet 82 may be provided at each cable entry port 80. The grommet 82 may be removably attached to the cable entry port 80. The grommet 82 may be formed of a flexible, resilient material that allows the grommet 80 to be cut, pierced, slit and the like.

The housing 12 may also include one or more large knockouts 84. As illustrated, each sidewall 20 includes a knockout 84. The knockouts 84 are configured to be knocked out or removed to expose an opening 86 for installing components such as a low voltage ring or an outlet box. Screw tabs 88 may be provided; the screw tabs 88 may be retained if a low voltage ring is being mounted or may be removed to install an outlet box.

As noted above, the provision of the support plate 14 allows for two layers of components to be mounted in the housing 12. It will be appreciated that the support plate effectively provides two relatively large mounting surfaces for mounting components within the housing and/or for enhanced cable management. It will also be appreciated that the pivotable support plate 14 allows for access of components mounted on the "rear layer" or the back wall 18 of the housing 12.

The removable section 52 of the support plate 14 and/or the reversible hinge clips 40 provide further installation flexibility. As noted above, the removable section 52 may be removed to accommodate larger (e.g., deeper) components such as a network music player. Further, the hinge clips 40 may be reversed to provide different layer depths for additional flexibility. For example, the support plate 14 may be held in the second position shown in FIG. 10B to allow for larger components to be mounted to the "front layer" or on the support plate 14 (e.g., to make such components more accessible and/or for improved ventilation).

Figure 11:
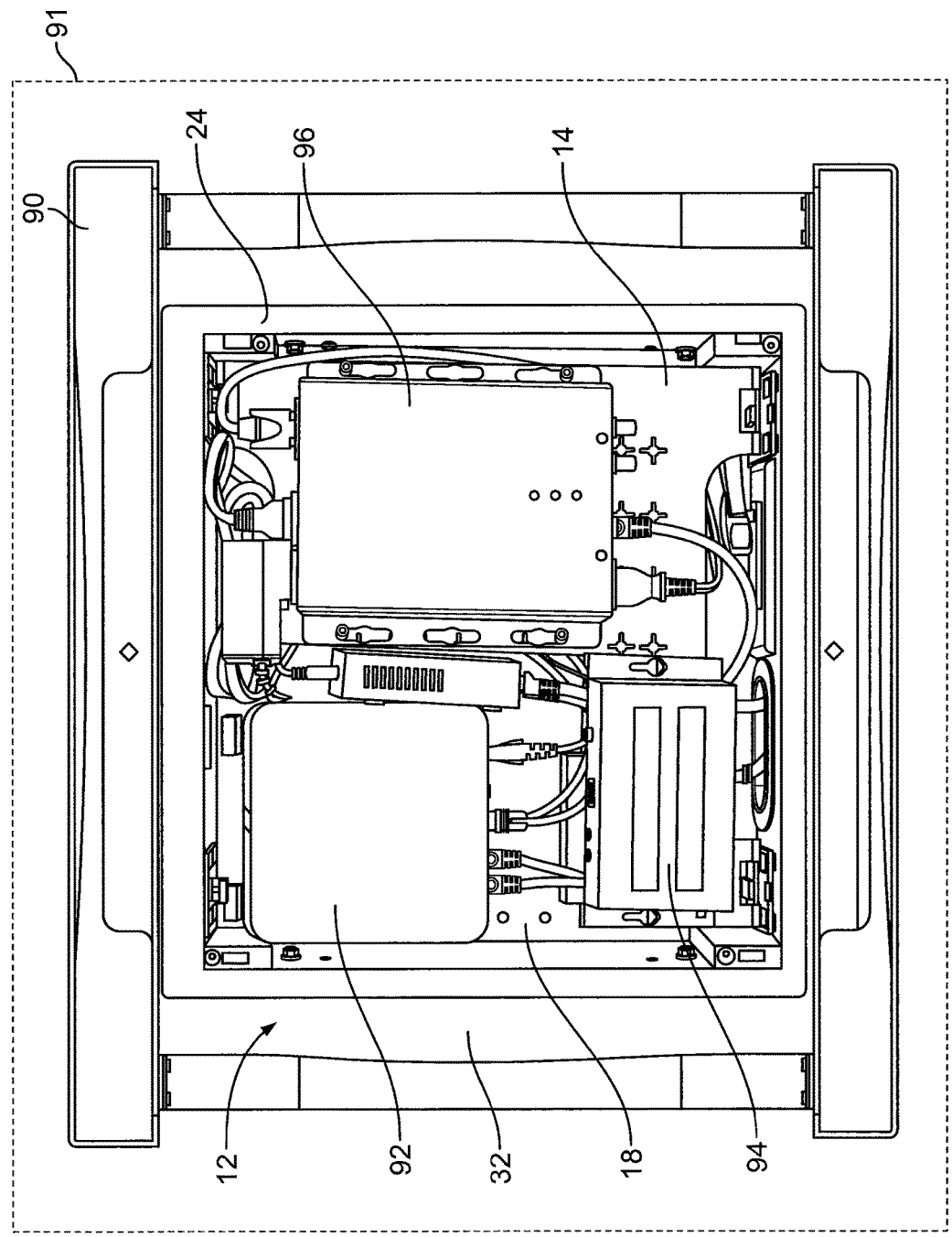
FIG. 11 is a front view of the housing and support plate of FIG. 1, with the housing mounted in a mounting surface and electronic components mounted to the housing and the support plate.
Figure 12:
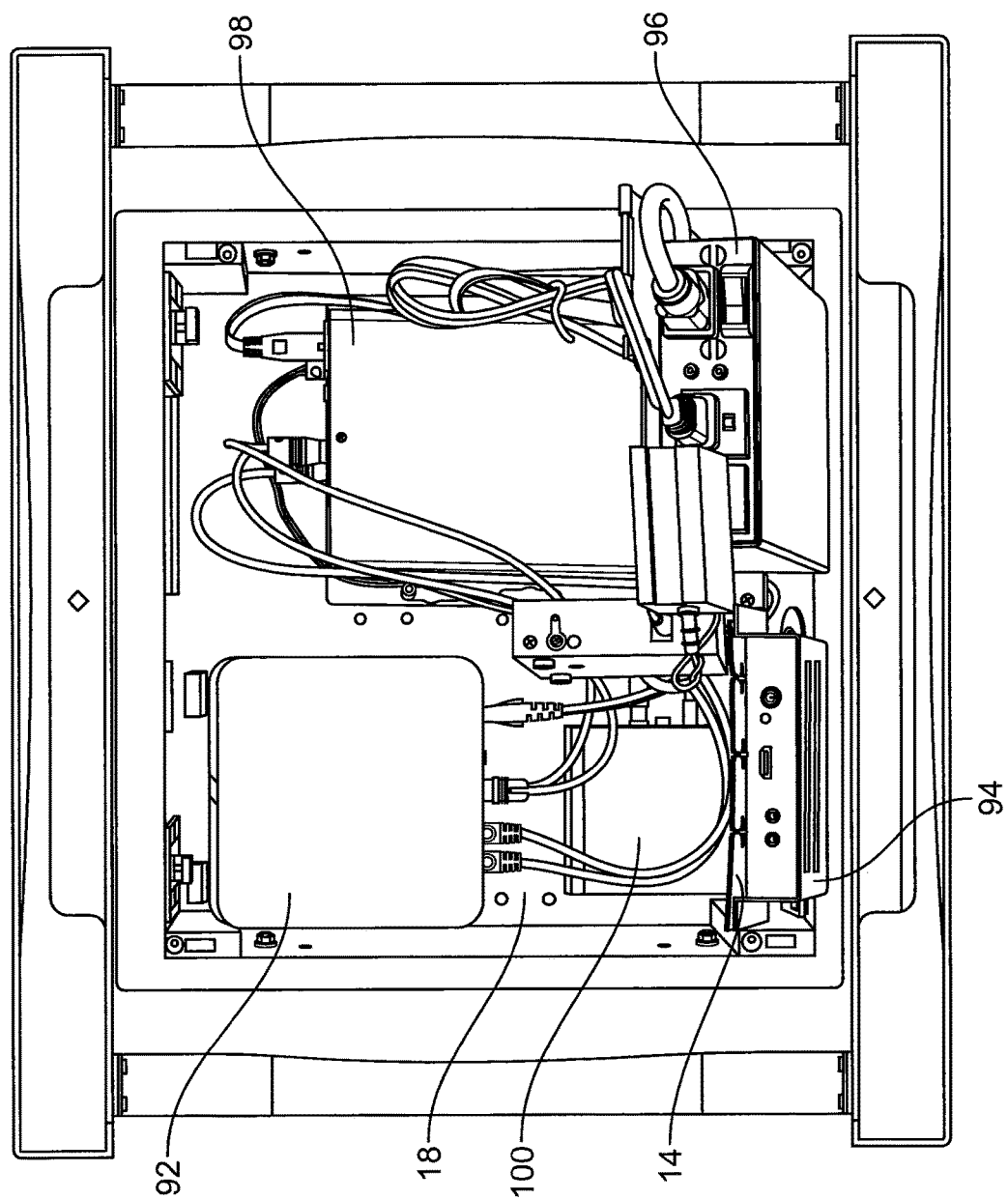
FIG. 12 is a front view of the housing and support plate of FIG. 11, with the support plate in a pivoted position and illustrating additional electronic components mounted to a back wall of the housing.

Some of these desirable characteristics are exemplified in FIGS. 11 and 12. The housing 12 is shown recessed in the mounting surface 32 with the housing flange 24 flush against the mounting surface 32. A portion of a flat panel display mount 90 is shown mounted to the mounting surface 32 and surrounding the housing 12. The display mount 90 may be used for mounting a flat panel display 91 in front of the housing 12 and associated components (e.g., the support plate 14, the components mounted to the housing 12 and the support plate 14 and/or the cover 16 which is not shown in FIGS. 11 and 12). The flat panel display can obscure these components and the recessed nature of the housing 12 allows for low profile mounting of the flat panel display.

As shown in FIG. 11, the removable section of the support plate 14 has been removed to accommodate a relatively large component 92 such as a network music player that is mounted to the back wall 18 of the housing 12. Additional components are shown mounted to the support plate 14, including an audio/video extender receiver 94 and a power conditioner 96.

In FIG. 12, the support plate 14 has been pivoted downwardly, thereby exposing additional components mounted to the housing back wall 18 (i.e., the second layer of components). As illustrated, these components include an amplifier 98 and a wireless subwoofer transmitter 100. Pivoting the support plate 14 allows access to these components, as well as additional access to the components 92, 94, 96 and any associated cables, wires, switches, etc.

A wide variety of components and equipment may be installed or mounted to the support plate 14 and/or the housing back wall 18. These include audio components such as amplifiers, wireless speaker transmitters and distributed audio components (Sonos, etc.) as well as video components such as distributed video components (HDMI extenders, etc.), cable boxes (e.g., DirecTV client box) and Smart TV boxes (Apple TV, Roku, etc.). Power products such as outlets, surge protectors and power conditioners and network components such as wireless access points, switches and routers may also be installed. Other equipment that may be installed includes control systems or processors (e.g., Pro Control), surveillance components (e.g., analog to digital converters) and cable management equipment.

Figure 13:
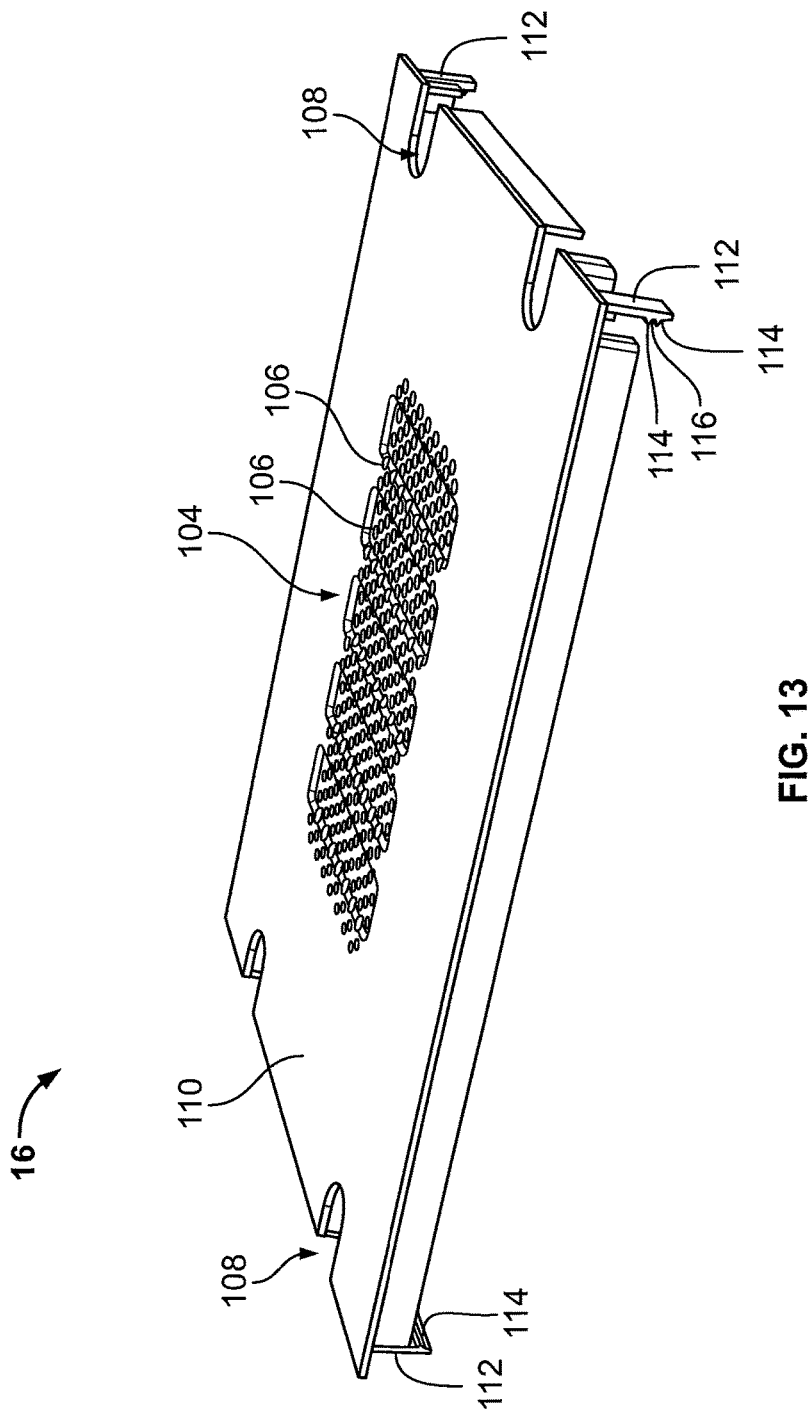
FIG. 13 is a top perspective view of the cover of FIG. 1 according to some embodiments.

The cover 16 is illustrated in FIG. 13. The cover 16 is configured to releasably attach or mount to the housing 12 to thereby enclose the components held in the housing 12 and/or provide a pleasing final appearance (which may be particularly desirable when the housing 12 and cover 16 are not obscured by an object such as a flat panel display, for example in ceiling installations). The housing 16 includes a vent 104 which, as illustrated, may include a plurality of spaced-apart apertures 106. A plurality of recesses 108 are provided to accommodate a user's fingers for attaching and removing the cover 16.

In some embodiments, the housing 12 and/or the cover 16 includes a height adjustment mechanism such that the cover 16 can be attached or mounted to the housing 12 in a variety of positions. Specifically, the height adjustment mechanism may allow the cover 16 to be mounted such that a front surface 110 of the cover 16 is generally flush with the flange 24 of the housing 12 or to be mounted at one or more positions with the front surface 110 positioned forwardly of the flange 24.

Figure 14:
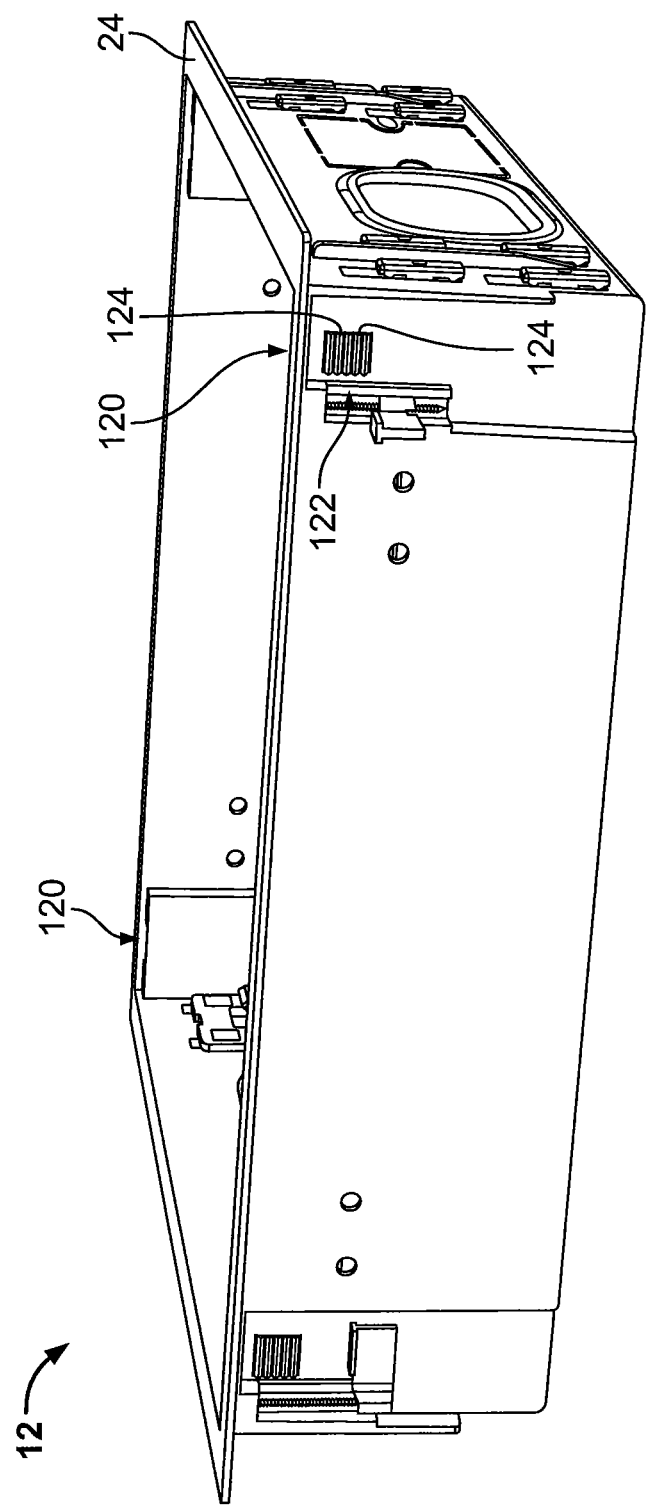
FIG. 14 is a side perspective view of the housing of FIG. 1 according to some embodiments.

As illustrated in FIGS. 13 and 14, the cover 16 includes a plurality of tabs 112 and the housing 12 includes a plurality of slots 120, with each slot 120 configured to receive a corresponding tab 112 when the cover 16 is attached to the housing 12. An inner surface of each tab 112 includes a pair of projections 114 defining a groove 116 therebetween. Each slot 120 includes a rack 122 including a plurality of projections 124 (with grooves formed between adjacent projections). The projections 114 and/or the groove 116 of each tab 112 is configured to engage the rack 122 of a corresponding slot 120 when the cover 16 is adjustably attached to the housing 12.

Figure 15:
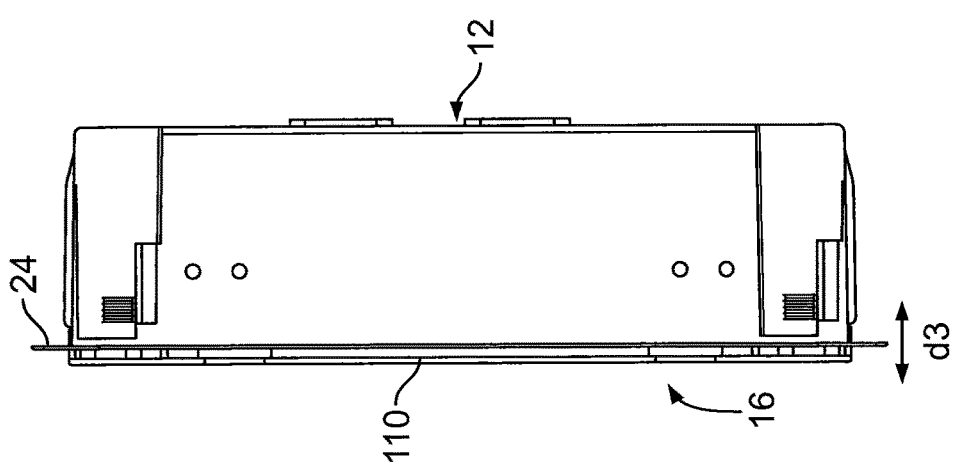
FIG. 15 is a side view of the housing and cover of FIG. 1 illustrating an adjustable connection of the housing and cover according to some embodiments.

Therefore, as shown in FIG. 15, the cover 16 can be mounted to the housing 12 in a variety of positions (indicated by the arrow d3). Such a configuration may be useful if the position and/or size of electronic equipment in the housing 12 prevents the cover from closing completely (e.g., with the cover front surface 110 flush with the housing flange 14). The height adjustment mechanism allows the cover to still be attached and left partially extended (e.g., with the cover front surface 110 positioned forwardly of the housing flange 24).

The cover 16 may be formed of any suitable material. In some embodiments, the cover 16 is metal; in other embodiments, the cover is formed of a polymer. In some embodiments, the cover 16 is formed of acrylonitrile butadiene styrene (ABS).

Figure 16:
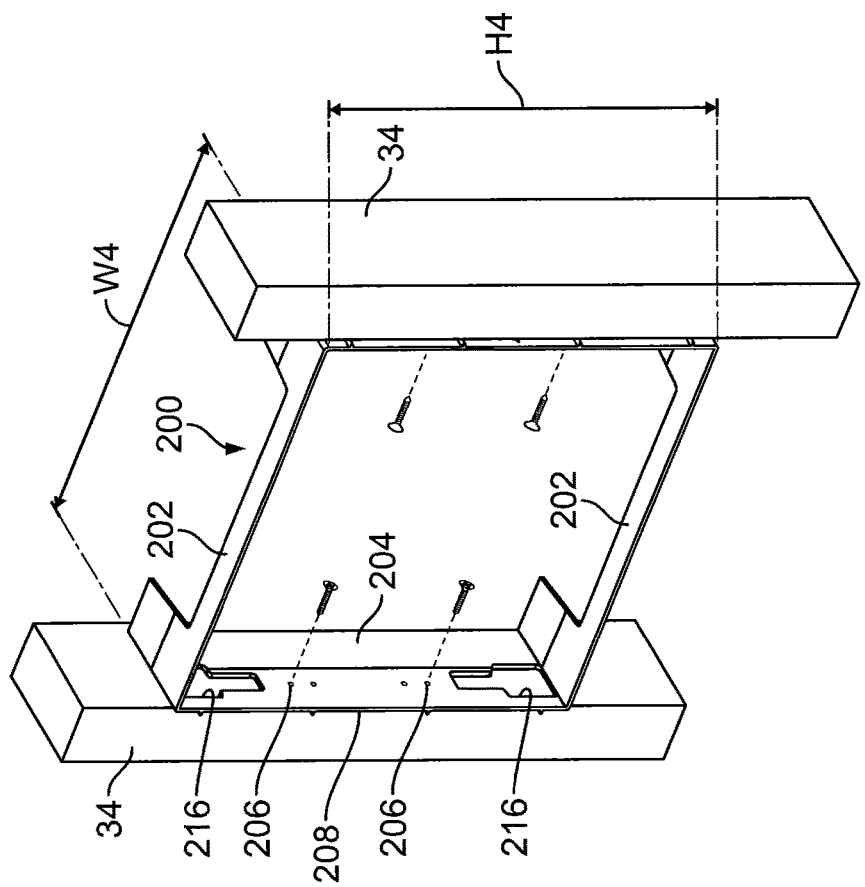
FIG. 16 is a perspective view of an installation or pre-construction bracket positioned between wall studs according to some embodiments.
Figure 18:
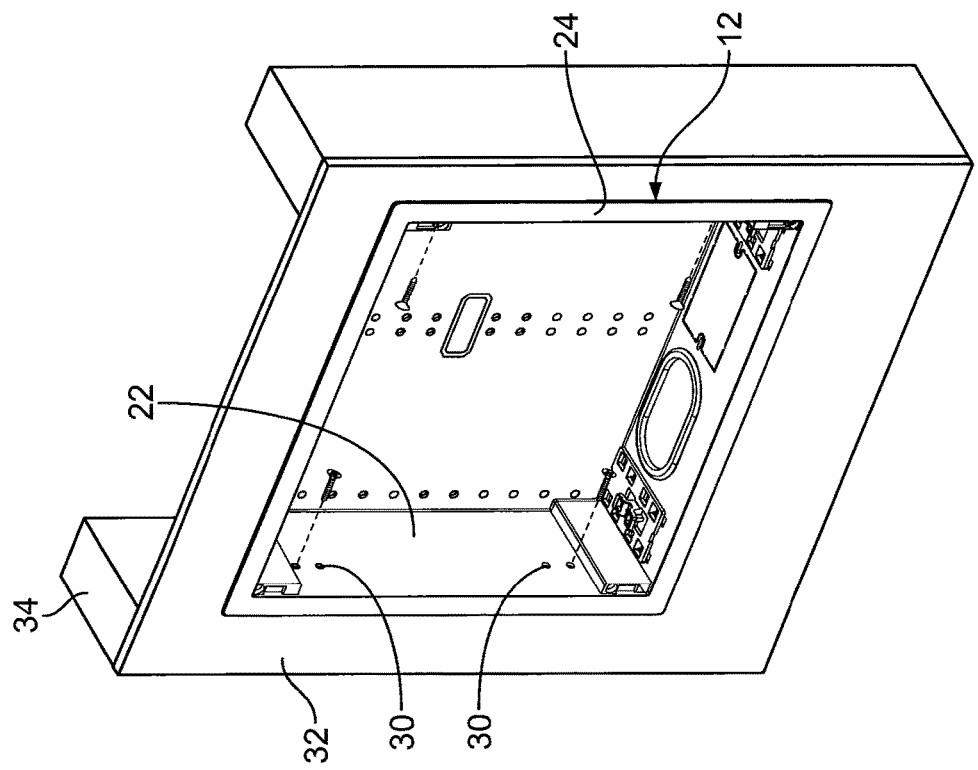
FIG. 18 is a perspective view of the housing of FIG. 1 positioned in the installation bracket of FIG. 16.
Figure 17:
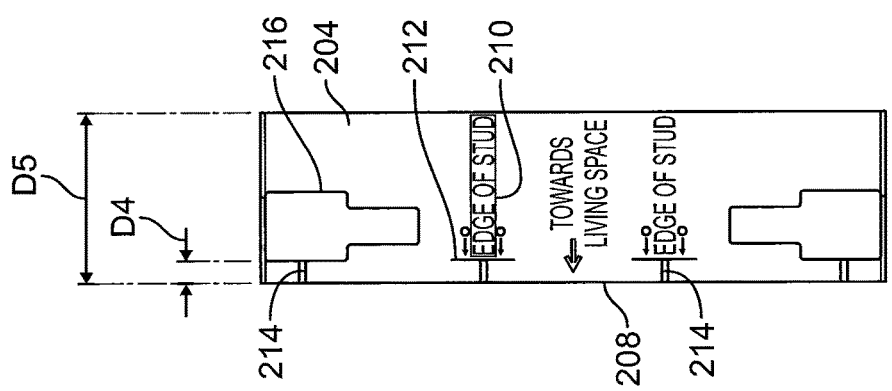
FIG. 17 is a side view of the installation bracket of FIG. 16.

An installation or pre-construction bracket or ring 200 is shown in FIGS. 16-18. The bracket 200 may be used to prepare a location for the housing 12 in "new work" applications before drywall is hung on the studs. The bracket 200 includes opposed top and bottom panels 202 and opposed side panels 204. The bracket 200 is sized and configured to fit between adjacent studs 34. The bracket 200 may have a height H4 of between about 12 and 16 inches, between about 13 and 14 inches, and about 13.8 inches in various embodiments. The bracket 200 may have a width W4 of between about 13.5 and 15.5 inches, between about 14 and 15 inches, and about 14.4 inches in various embodiments. In various embodiments, the bracket 200 may have a depth D5 of between about 3 and 5 inches, between about 3 and 4 inches, and about 3.75 inches.

The bracket 200 may be formed of any suitable material. In some embodiments, the bracket 200 is metal; in other embodiments, the cover is formed of a polymer. In some embodiments, the bracket 200 is formed of acrylonitrile butadiene styrene (ABS).

Each side panel 204 of the bracket 200 includes one or more bracket mounting apertures 206. The bracket mounting apertures 206 are configured to receive fasteners therethrough to mount the bracket 200 to the studs 34. It is contemplated that the bracket 200 may be coupled to the studs 34 in different ways; for example, the bracket 200 may be sized to be push fit between the studs 34 and/or be adhered to the studs 34.

As shown in FIG. 17, each side panel 204 of the bracket 200 includes one or more alignment features for positioning the bracket 200 such that a front 208 of the bracket 200 extends forwardly an extended distance D4 in front of the studs 34. The extended distance D4 accounts for the thickness of the drywall which is later applied to the studs 34. In some embodiments, the extended distance D4 is about 0.5 inches.

The alignment feature(s) may include indicia 210, 212 on an outer surface of the bracket side panels 204. The indicia 210 may include written indicia such as "Edge of Stud." The indicia 212 may include a guide line that is spaced apart the extended distance D4 from the front 208 of the bracket 200.

The alignment feature(s) may include a plurality of raised projections 214 on the outer surface of the bracket side panels 204. The raised projections 214 extend along the side panel 204 from the bracket front 208 to a depth corresponding to the extended distance D4.

Drywall 32 may be applied after the bracket 200 is positioned and mounted to the studs 34 as described above. The equipment box housing 12 is then positioned within the bracket 200 with the housing flange 24 flush against the drywall 32. Each bracket side panel 204 includes one or more openings 216. With the housing 12 in position, the aperture(s) 30 in the housing sidewalls 22 align with the bracket openings 216. The housing 12 is then secured to the studs 34 using fasteners that extend through the apertures 30 and the openings 216.

The housing 12 may be prepared (e.g., by opening various knockouts) prior to placing the housing 12 in position. The support plate 14 and the cover 16 may then be installed as described above. Embodiments of the invention include kits including any combination of the housing 12, the support plate 14, the cover 16 and the bracket 200.

Figure 19:
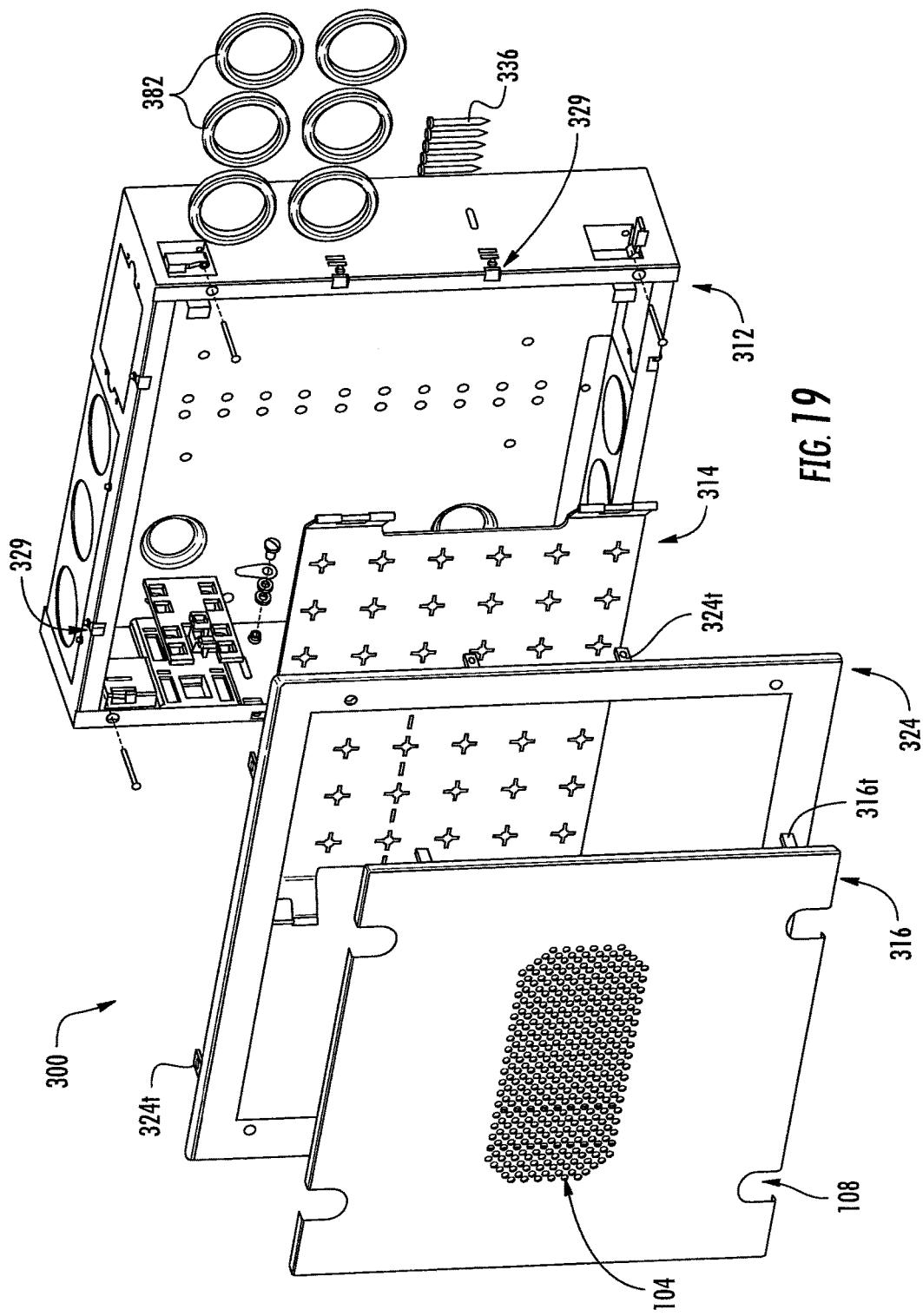
FIG. 19 is an exploded perspective view of an equipment box assembly including a housing, a support plate and a cover according to some other embodiments.

An equipment box assembly 300 according to some other embodiments is shown in FIG. 19. The assembly 300 includes a housing 312, a support plate 314, a cover 316 and a flange, bezel or edge trim 324. The housing 312, the support plate 314 and the cover 316 are similar to the housing 12, support plate 14 and cover 16 of the assembly 10 (FIG. 1), with the primary differences being highlighted below.

Figure 20:
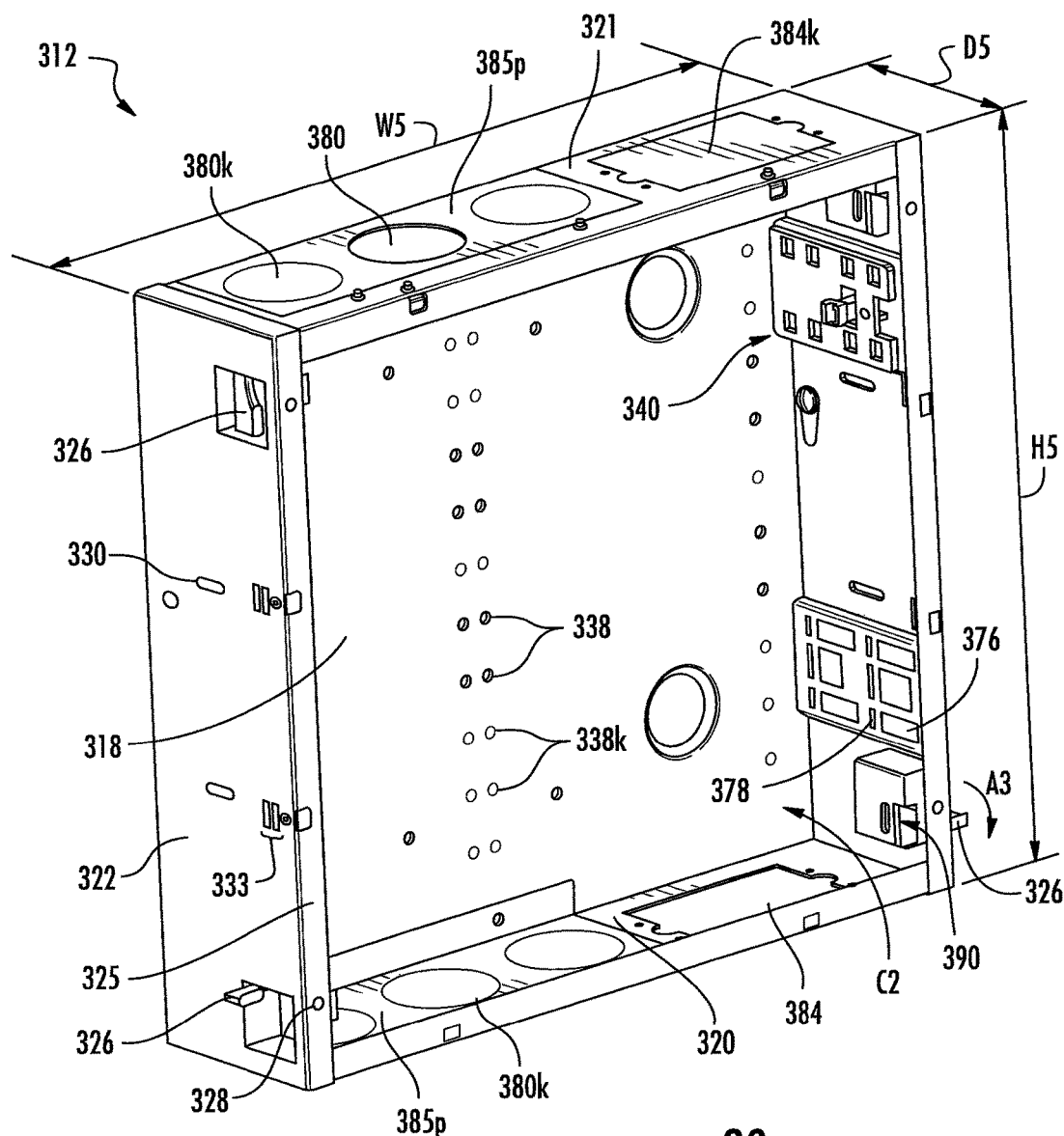
FIG. 20 is a perspective view of the housing of FIG. 19.

Turning to FIG. 20, the housing 312 includes a back panel or wall 318, a bottom wall 320 and an opposed top wall 321, and a pair of opposed sidewalls 322. The back wall 318, the bottom wall 320, the top wall 321 and the sidewalls 322 define an open cavity C2 in the housing 312.

The housing 312 may include a variety of mounting features for mounting or recessing the housing 312 in a mounting surface. A plurality of doglegs or tabs 326 are coupled to the housing 312 by fasteners 328 (e.g., a screw or other threaded fastener). As indicated by the arrow A3 in FIG. 20, each dogleg 326 is configured to be moved from a retracted position with the dogleg 326 generally parallel to one of the sidewalls 322 to an extended position with the dogleg 326 generally perpendicular to the sidewall 322. Each dogleg 326 may be moved between the retracted and extended positions by manipulating its associated fastener 328. Each dogleg 326 may also be advanced toward a front surface 325 of the housing 312 and away from the front surface 325 by manipulating the fastener 328. Each sidewall 322 also includes one or more apertures 330 extending therethrough. The apertures 330 may be elongated slots.

Figure 21:
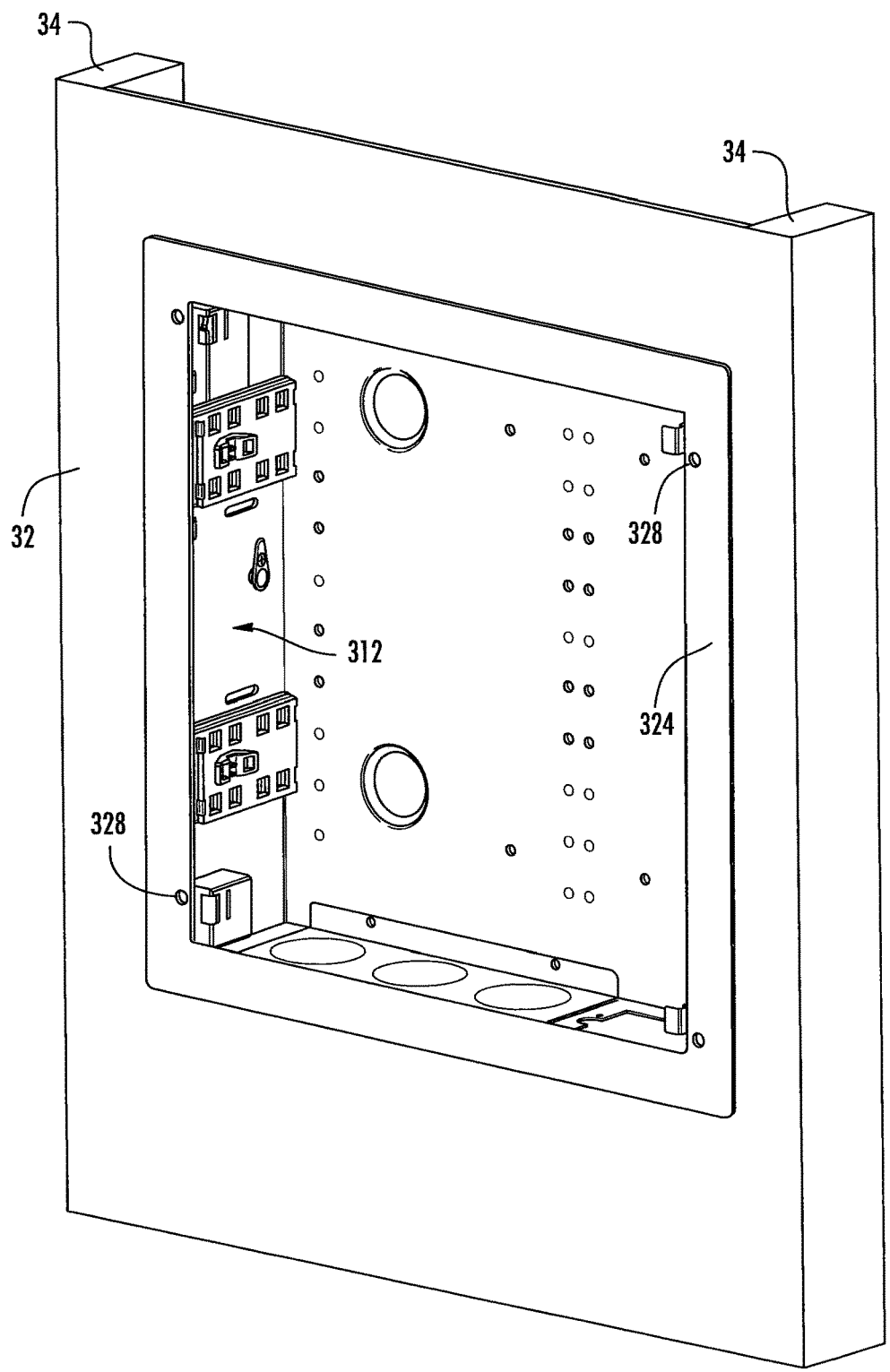
FIG. 21 is a perspective view of the housing of FIG. 19 installed in a mounting surface.
Figure 22:
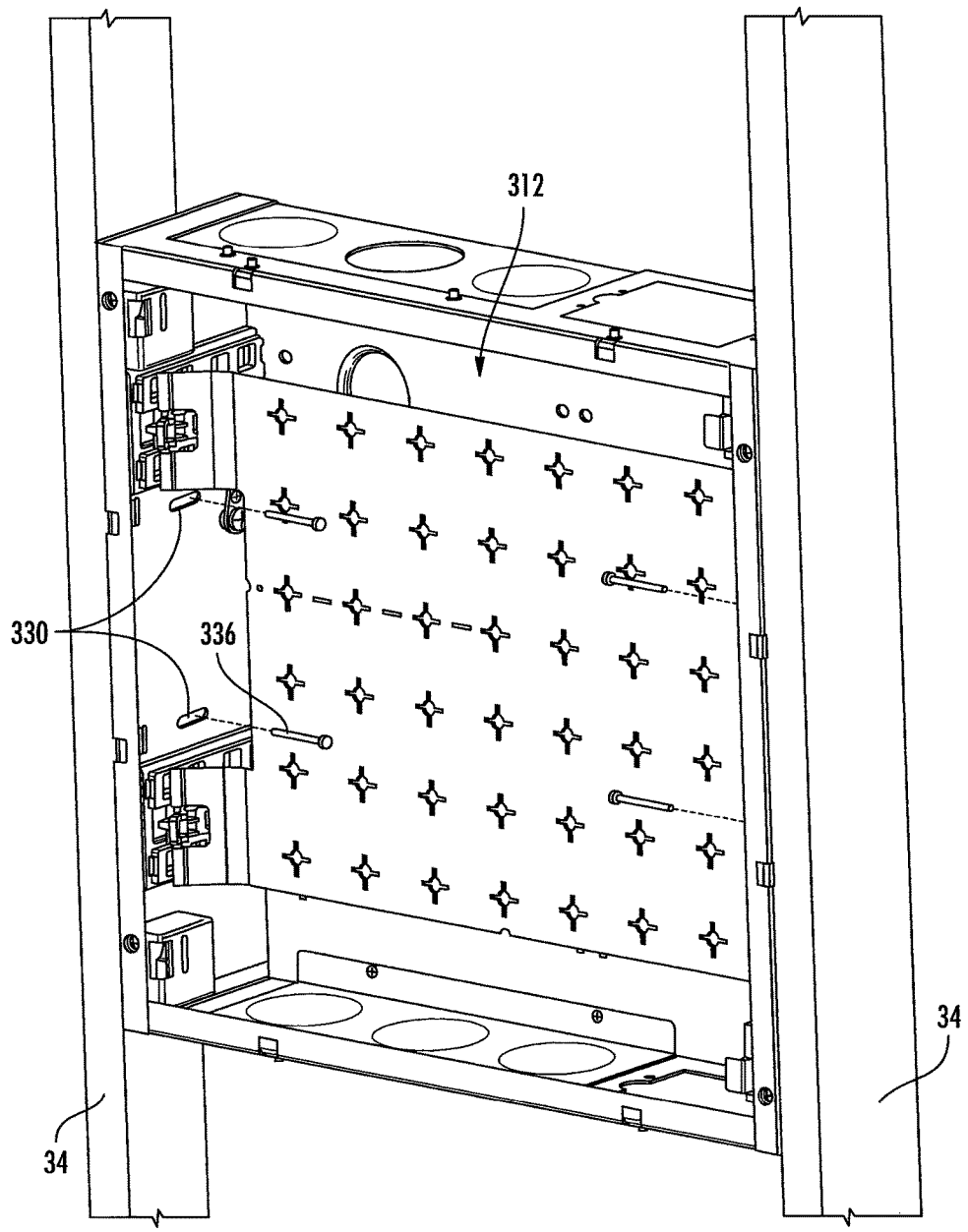
FIG. 22 is a perspective view of the housing of FIG. 19 being mounted to frame members.

As illustrated in FIGS. 21 and 22, the housing 312 may be positioned in an installed position within a mounting surface 32, such as a ceiling or a wall. The mounting surface 32 may be drywall, sheetrock, plaster or the like and may be disposed on frame members 34, such as joists or studs. The housing 312 is sized to fit between adjacent frame members 34 with the bezel 324 flush against the mounting surface 32. For example, the housing 312 may be sized to fit between studs that are 16 inches on center.

FIG. 21 illustrates "old work" installation; that is, installation after drywall 32 is hung on the studs 34. A template may be provided to mark the drywall 32. The template may have generally the same height and width as a height H5 and a width W5 of the housing 312 (FIG. 20). Alternatively, an installer may outline the housing 312 to mark the drywall 32. An opening may be cut in the drywall 32 corresponding to the mark on the drywall 32. The housing 312 may be inserted into the opening and the housing 312 may be secured to the drywall 32 using the doglegs 326 (FIG. 20) by manipulating the fasteners 328. That is, the doglegs 326 may be advanced toward the housing front surface 325 (FIG. 20) and against the drywall 32. The bezel 324 may be secured to the housing front surface 325 (FIG. 20) for a finished appearance. For example, referring to FIGS. 19 and 20, the bezel 324 may include one or more tabs 324t (e.g., two tabs on each side of the bezel 324 and two tabs on each of the top and bottom of the bezel) and the housing 312 may include one or more mounting features 329 (e.g., two mounting features on each sidewall 322 and two tabs on each of the top wall 321 and the bottom wall 320). The tabs 324t and the mounting features 329 may engage to couple the bezel 325 to the housing. According to some embodiments, an aperture is defined in each tab 324t and the mounting features 329 are apertures that are positioned and configured to align with the apertures defined in the tabs 324t. Fasteners may be received through the aligned apertures to couple the bezel 324 to the housing 312.

Additionally or alternatively, fasteners 336 (e.g., a screw or other threaded fastener, see FIG. 19) may be received through the apertures 330 in the housing sidewalls 322 (FIG. 20) and advanced into the frame members or studs 34. This may be useful if one or more of the doglegs 326 does not extend correctly due to insufficient clearance between the housing sidewall 322 and the stud 34.

FIG. 22 illustrates "new work" installation; that is, installation before drywall is hung on the studs 34. The housing 312 is inserted between the studs 34. The fasteners 336 (e.g., a screw or other threaded fastener, see FIG. 19) are received through the apertures 330 in the housing sidewalls 322 and advanced into the frame members or studs 34. Once the drywall is installed, the bezel 324 (FIG. 19) may be secured to the housing front surface 325 (FIG. 20) for a finished appearance. In addition, the doglegs 326 may be used if the distance between the studs is greater than the width W5 of the housing 312 (FIG. 20).

In some embodiments, for "new work" applications, indicia 333 (FIG. 20) in the form of a plurality of parallel lines may be included on each of the sidewalls 322. The indicia 333 allows an installer to position the front surface 325 of the housing 312 forward of the studs 34 to account for the thickness of the drywall that is yet to be hung. For example, the indicia 333 could include lines at ½ inch, ⅝ inch and/or ¾ inch behind the housing front surface 325. The installer may align the appropriate line with the front of the studs 34 and then mount the housing 312 to the studs 34 using the fasteners 336.

Referring again to FIG. 20, a plurality of mounting features may be provided on the back wall 318 of the housing 312 for mounting items such as electronic components to the back wall 318. As illustrated, the mounting features may include apertures 338 formed through the back wall 318. The back wall 318 may also include a plurality of small knockouts 338k that are configured to be knocked out or removed to provide additional apertures as needed. The knockouts 338k are optional; according to some embodiments, the knockouts 338k shown in FIG. 20 are apertures 338. Clips, hooks, hook and loop fasteners, straps and other mounting features known to those of skill in the art may also be employed.

The housing 312 may be formed of any suitable material. In some embodiments, the housing 312 is metal such as steel.

The housing 312 may be generally rectangular or square. Referring to FIG. 20, the housing 312 may have a height H5 of between about 11 and 15 inches, between about 12 and 14 inches, and about 13.3 inches in various embodiments. The housing 312 may have a width W5 of between about 13 and 15 inches, between about 13.5 and 14.5 inches, and about 14.25 inches in various embodiments. The housing 312 may have a depth D5 of between about 2 and 6 inches, between about 3 and 5 inches, and about 3.75 inches in various embodiments.

In some other embodiments, the housing 312 has an elongated width relative to its height. For example, the housing 312 may have a width W5 of about 14.25 inches and a height H5 of about 8.3 inches.

Still referring to FIG. 20, the housing 312 may include one or more first knockouts 380k. As illustrated, the bottom wall 320 and the top wall 321 each include a plurality of first knockouts 380k. The first knockouts 380k are configured to be knocked out or removed to expose a cable entry opening or port 380 for cable or wire management. A grommet 382 (FIG. 19) may be installed at each cable entry port 380. The grommet 382 may be removably attached to the cable entry port 380. The grommet 382 may be formed of a flexible, resilient material that allows the grommet 382 to be cut, pierced, slit and the like.

The housing 12 may also include one or more second knockouts 384k. As illustrated, each of the bottom wall 320 and the top wall 321 includes a second knockout 384k. The knockouts 384k are configured to be knocked out or removed to expose an opening 384 for installing components such as a low voltage ring or an outlet box.

A panel 385p may be releasably fastened to the housing 312 at the bottom wall 320 and/or the back wall 318. The panel 385p can be removed and an electronic device such as a power conditioner can be dropped in and mounted to the housing 312.

Figure 23:
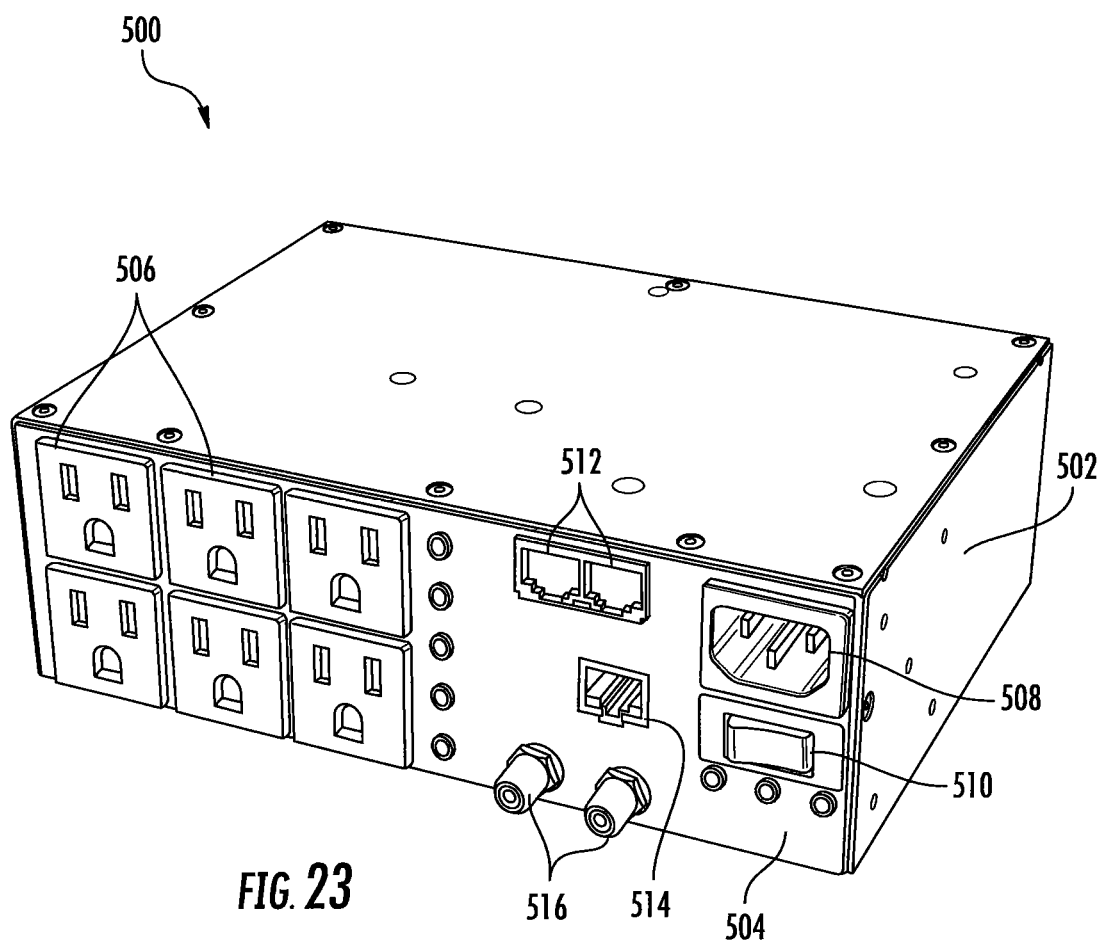
FIG. 23 is a perspective view of a power conditioner that can be mounted in the housing of FIG. 19.

A power product 500 such as a power conditioner suitable for mounting in the housing 312 is illustrated in FIG. 23. The power conditioner 500 includes a housing 502. A plurality of outlets 506 are on a front surface 504 of the housing 502. Also on the housing front surface 504 is a power cable port 508 for connecting the power conditioner 500 to a power source. Various other features may be included on the housing front surface 504 including a power switch 510, protected pass-though ports 512 for Ethernet or telephone cable (e.g., RJ45 cable), a network connection port 514 and/or pass-through ports 516 for cable or satellite cable (e.g., coaxial cable). The power conditioner 500 may include additional components or features as understood by those skilled in the art.

Figure 24A:
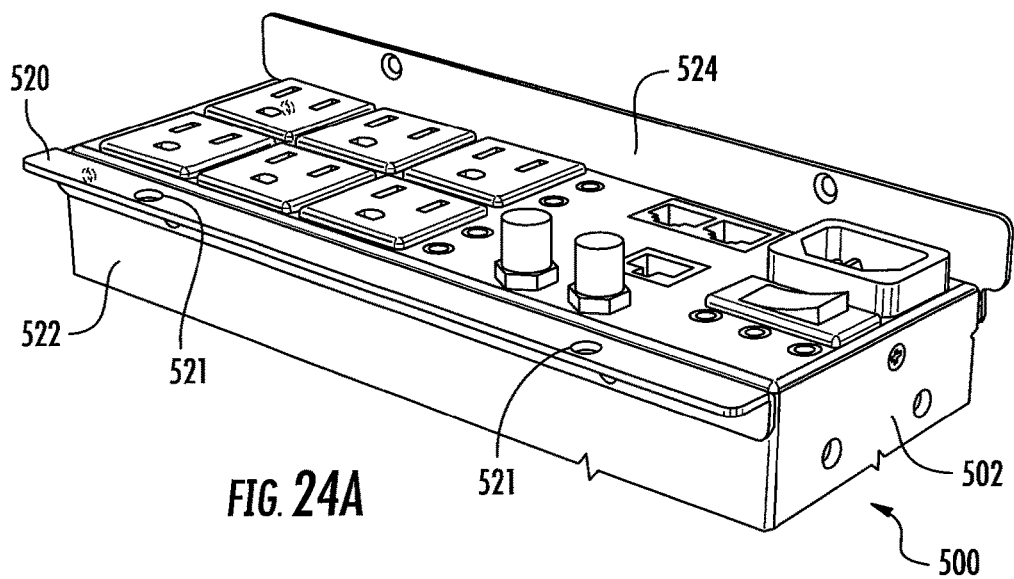
FIGS. 24A and 24B are perspective views of the power conditioner of FIG. 23 with brackets mounted thereto.
Figure 24B:
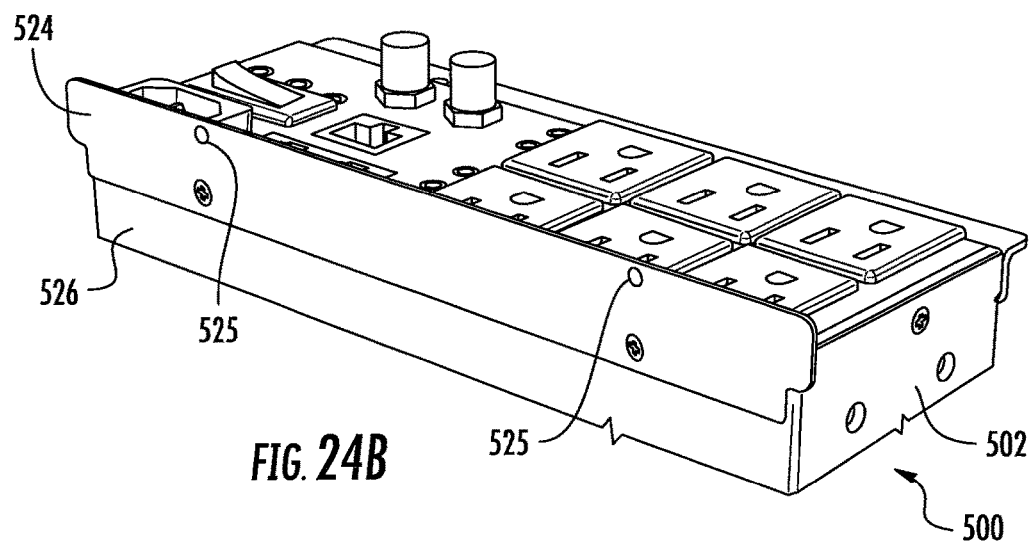

As illustrated in FIG. 24A, a first bracket 520 (e.g., an angled or L-shaped bracket) may be fastened to a bottom surface 522 of the power conditioner housing 502. As illustrated in FIG. 24B, a second bracket 524 (e.g., a flat bracket) may be fastened to a top surface 526 of the power conditioner housing 502. In some embodiments, the first bracket 520 and/or the second bracket 524 may be integrally formed with the power conditioner housing 502.

Figure 25:
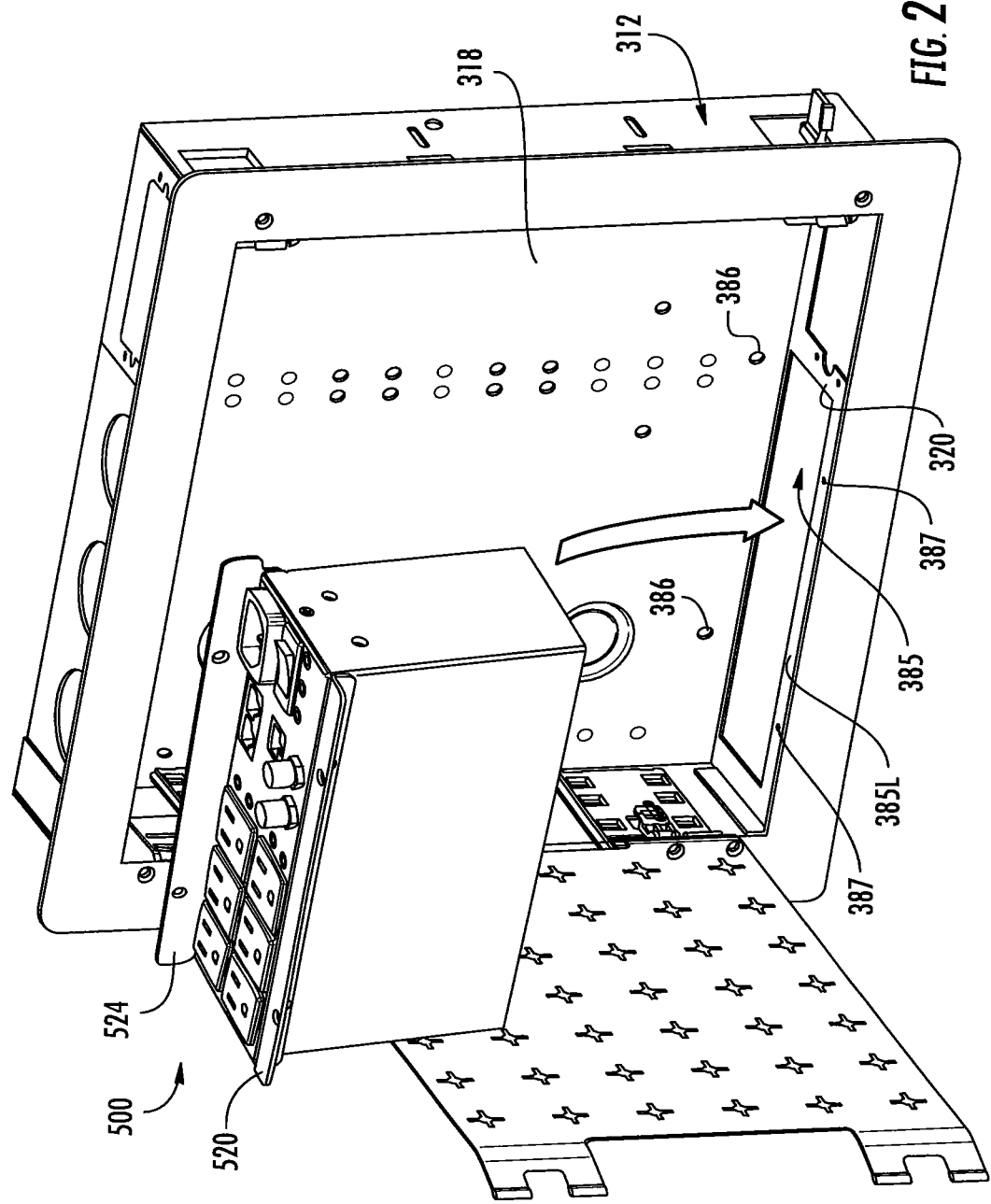
FIG. 25 is a perspective view of the power conditioner of FIG. 23 being dropped in the housing of FIG. 19.

Referring to FIG. 25, an opening 385 is defined in the bottom wall 320 of the housing 312 when the panel 385p (FIG. 20) is removed. The opening 385 may be defined in part by a ledge 385L of the bottom wall 320. The power conditioner 500 with the brackets 520, 524 is shaped, sized and configured to be securely mounted to the housing 312. Specifically, as shown in FIGS. 25 and 26, the power conditioner 500 may be dropped in the housing 312 such that a major portion of the power conditioner housing 502 is received through the opening 385 while the brackets 520, 524 engage the housing 312 to hold the power conditioner 500 in place.

Figure 26:
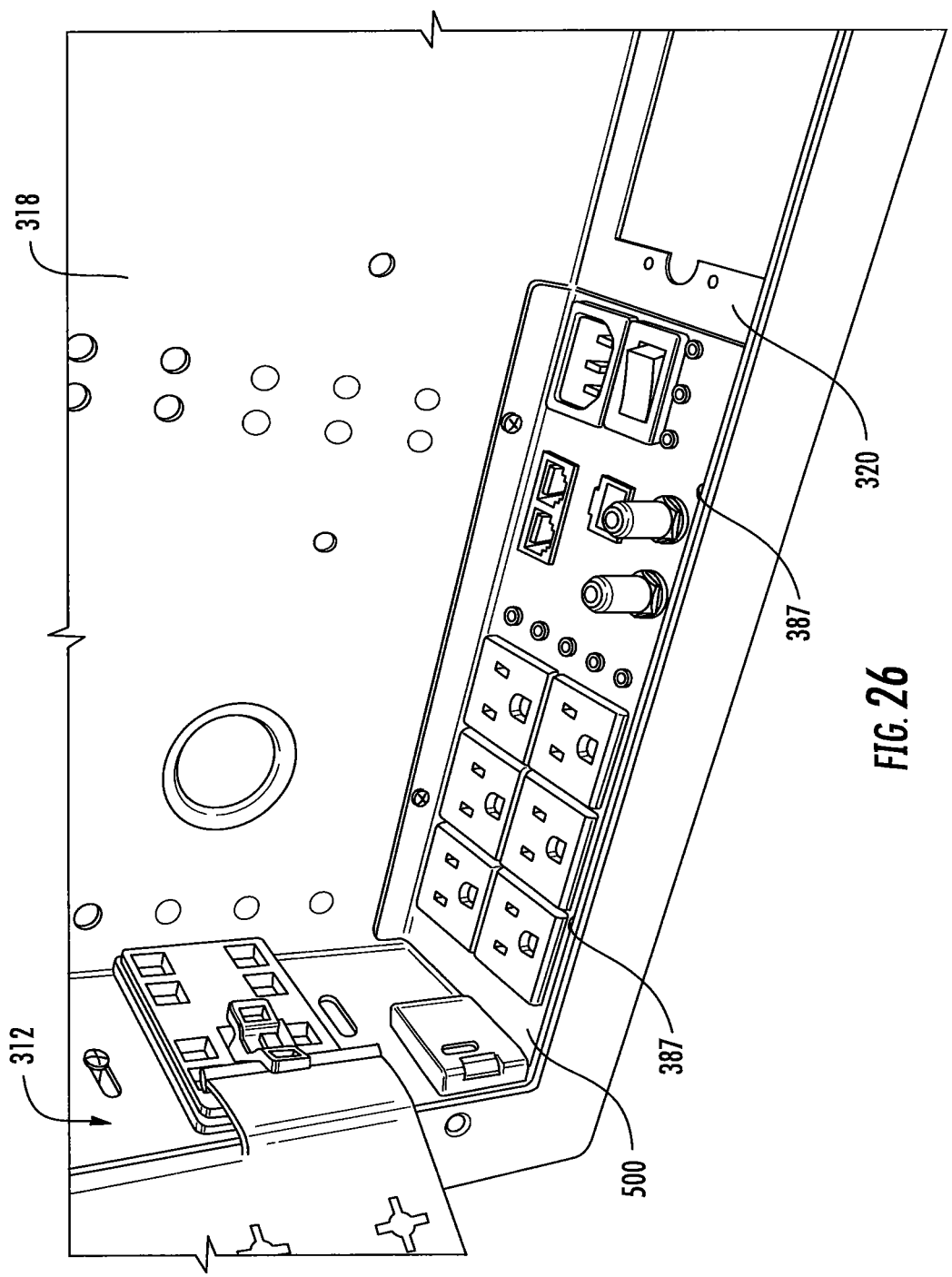
FIG. 26 is a fragmentary perspective view of the power conditioner of FIG. 23 held in the housing of FIG. 19.

The second bracket 524 may include one or more apertures 525 (FIG. 24B) for fastening the second bracket 524 to the back wall 318 of the housing 312 (FIG. 26). The apertures 525 may be aligned with apertures 386 formed in the housing back wall 318 (FIG. 25), and fasteners may be received through the aligned apertures. The first bracket 520 may include one or more apertures 521 (FIG. 24A) for fastening the first bracket 524 to the bottom wall 320 of the housing 312 (FIG. 26). The apertures 521 may be aligned with apertures 387 formed in the housing bottom wall 320 and/or the ledge 385L (FIGS. 25 and 26), and fasteners may be received through the aligned apertures. These features may be used to further secure the power conditioner 500 to the housing 312.

In some embodiments, the equipment box assembly 300 includes the power conditioner 500.

Figure 28:
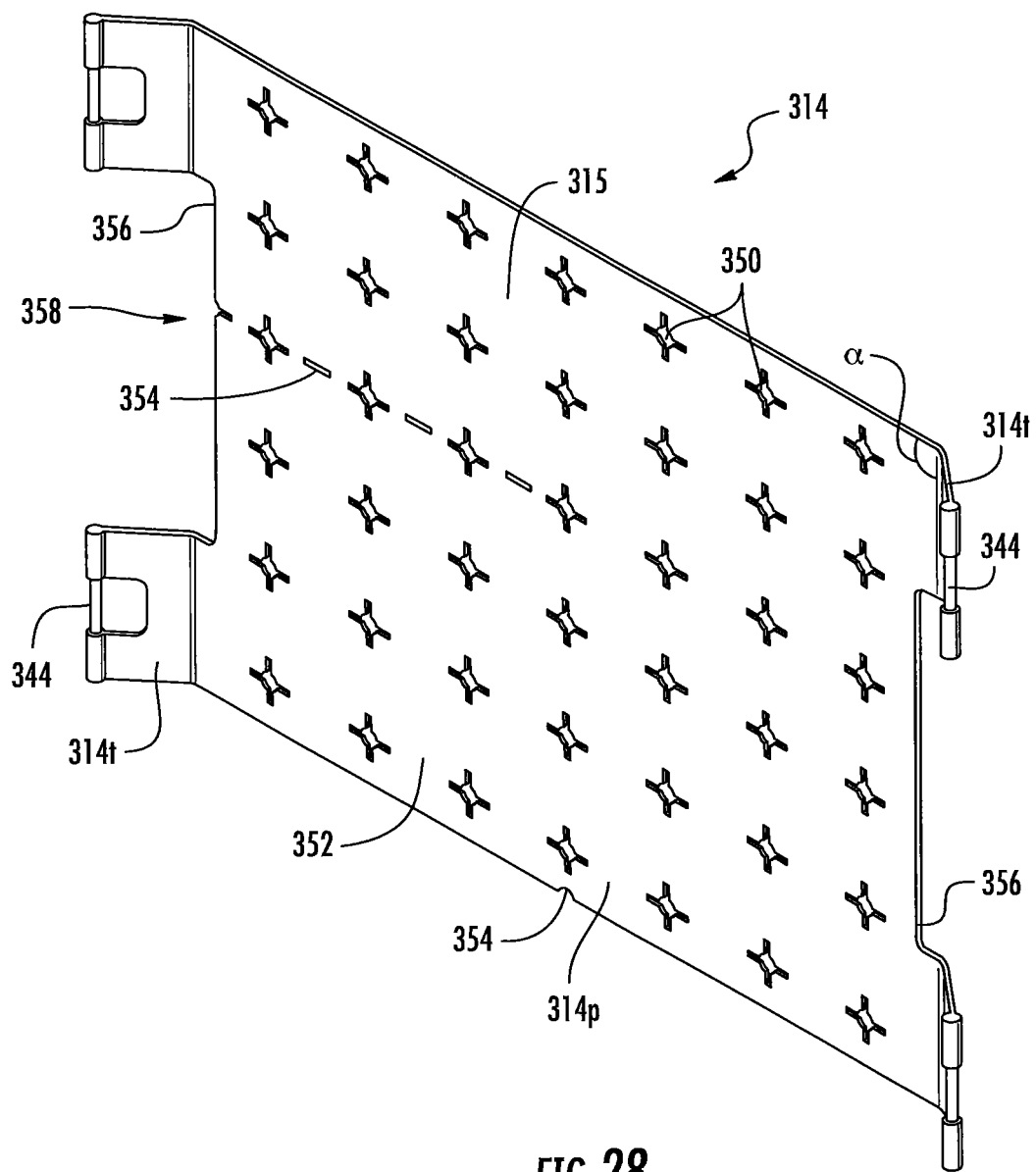
FIG. 28 is a perspective view of the support plate of FIG. 19.

FIG. 28 illustrates the support plate 314. The support plate 314 includes a plurality of apertures or perforations 350 extending therethrough. The apertures 350 are for mounting items such as electronic equipment and/or for cable or wire management. In some embodiments, and as illustrated, the apertures 350 may include a center opening and a plurality of elongated slots extending away from the center opening. Clips, hooks, hook and loop fasteners, straps and other mounting features known to those of skill in the art may also be employed in addition to or instead of the apertures 350.

The support plate 314 may include a removable section 352. Score lines 354 extend to or near adjacent transverse edges of the support plate 314 to facilitate removal of the removable section 352. The removable section 352 may be removed using a tool (e.g., tin snips) and/or by bending (e.g., fatiguing) the support plate 314 at the score lines 354. Removal of the removable section 352 may be desirable when a relatively large (deep) electronic component is mounted to the back wall 318 of the housing 312 (FIG. 20). Additional portions of the support plate 314 may be selectively removed as needed, for example using tin snips.

The support plate 314 includes a primary plate member or portion 314p. A pair of tabs or tab members or portions 314t extend away from each one of opposing edge portions 356 of the primary plate member 314p. Each of the tabs 314t is angled relative to the primary plate portion 314p. Specifically, each tab member 314t extends away from the primary plate portion 314p such that an angle α is defined between the primary plate member 314p (or a first side or surface 315 thereof) and the tab 314t. In some embodiments, the angle α is an obtuse angle. A pivot bar 344 is at a distal end of each tab member 314t.

A recess or valley 358 is defined between the tab members 314t at each opposing edge portion 356 of the plate member 314p. The recesses 358 may facilitate cable management. The recesses 358 may also allow a user to grip the support plate to insert, remove and/or pivot the support plate 314 with respect to hinge clips 340 that are described below.

The support plate 314 may be formed of any suitable material. In some embodiments, the support plate 314 is metal such as steel.

Figure 27:
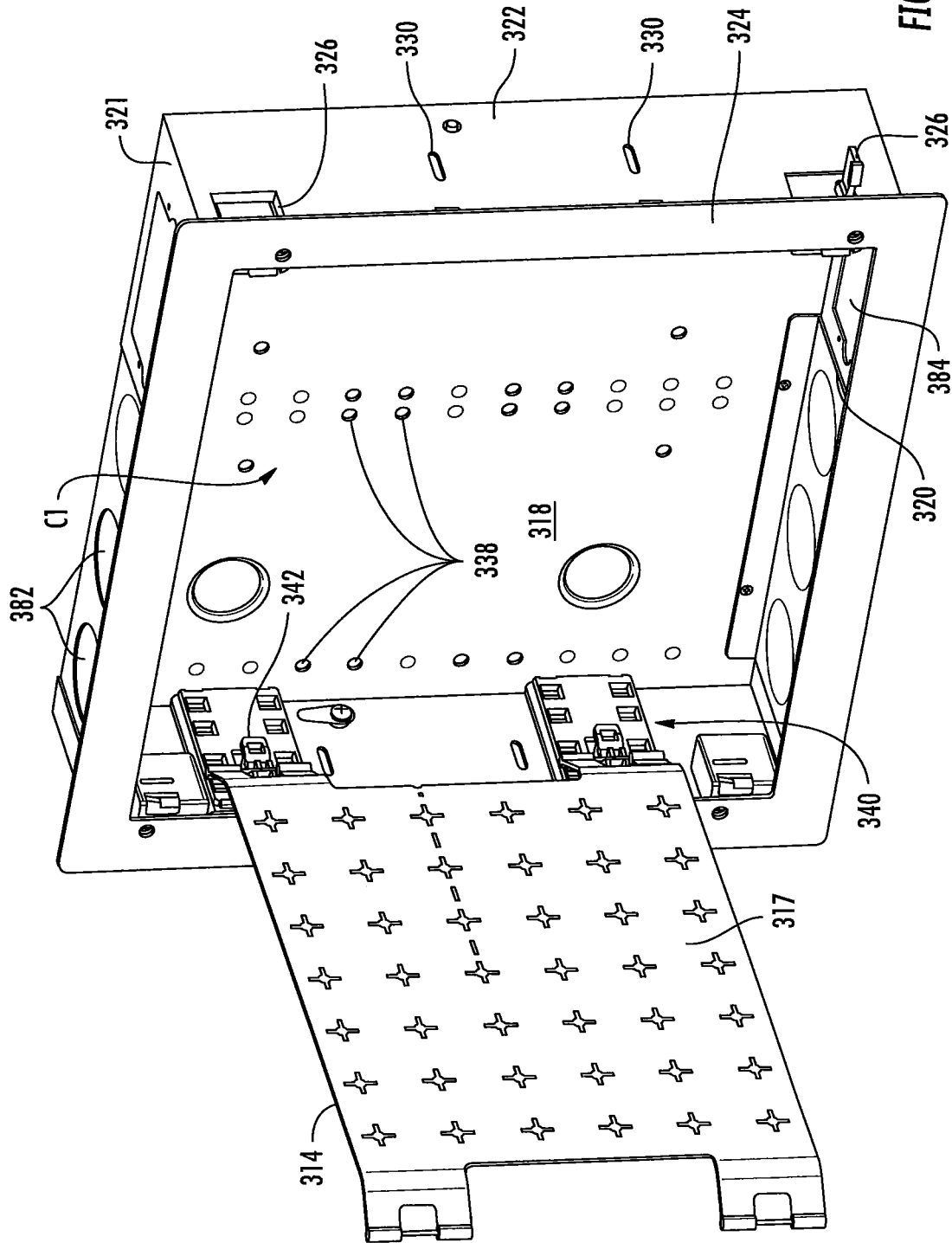
FIG. 27 is a perspective view of the support plate pivotably connected to the housing of FIG. 19.

At least one hinge bracket or hinge clip may be provided on each sidewall 322 of the housing 312. As illustrated in FIG. 27, two spaced apart hinge brackets or hinge clips 340 are provided on each sidewall 322 of the housing 312 (although it is contemplated that one hinge clip 340 or more than two hinge clips 340 may be provided on each sidewall 322). As illustrated, the support plate 314 may be pivotably coupled to the hinge clips 340 such that the support plate 314 may be disengaged from one pair of the hinge clips 340 and pivoted at the other pair of the hinge clips 340.

Figure 29:
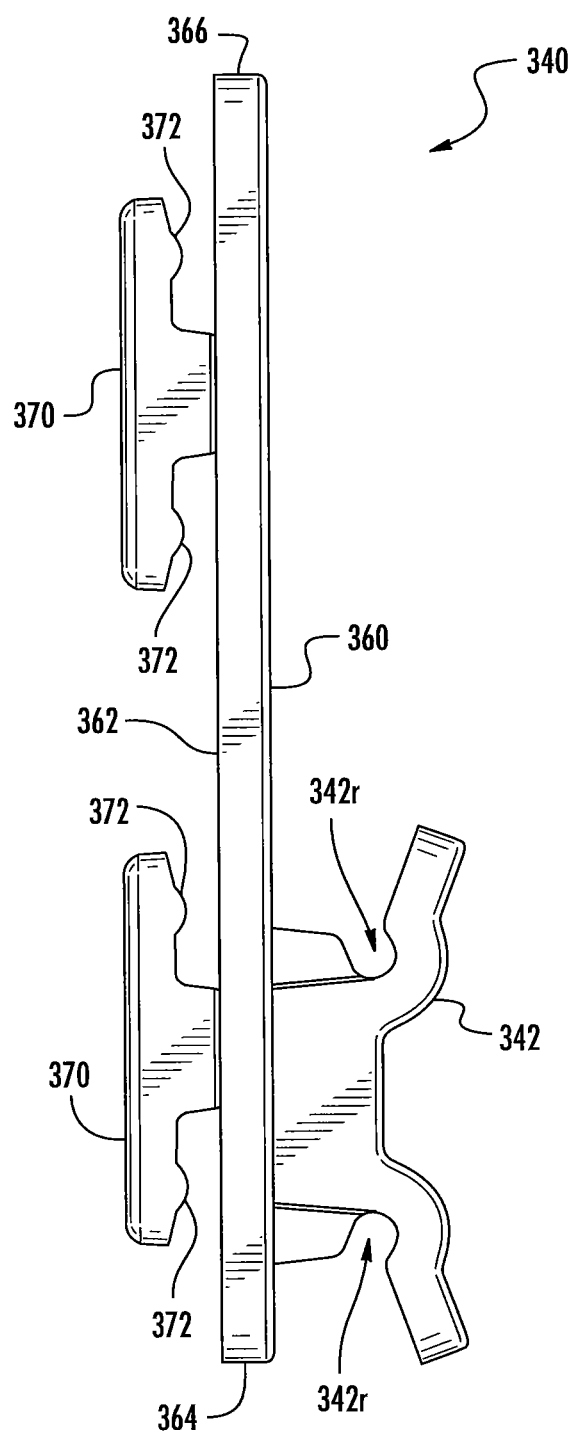
FIG. 29 is a side view of a hinge clip that can be mounted in the housing of FIG. 19.

One of the hinge clips 340 is shown in greater detail in FIG. 29. The hinge clip 340 includes opposing faces 360, 362 and opposite ends 364, 366. A clip member 342 is provided on the face 360 and includes a pair of receiving pockets or portions 342r. As will be described in greater detail below, the hinge clips 340 can be reversibly mounted to the housing 312 such that a respective hinge clip 340 can be mounted to the housing in first and second reversed configurations or positions. One of the receiving pockets 342r is configured to receive one of the support plate pivot bars 344 (FIG. 28) when the hinge clip 340 is in the first configuration, and the other one of the receiving pockets 342r is configured to receive the pivot bar 344 when the hinge clip 340 is in the second configuration. The clip member 342 is positioned closer to the end 364 than the end 366 such that the support plate 314 will be spaced apart a different distance from the housing back wall 318 when the hinge clips 340 are in the different configurations (e.g., the distances d3 and d5 shown in FIGS. 31A and 31B).

Referring again to FIG. 27, each of a pair of support plate pivot bars 344 may be disengaged with its associated hinge clip member 342 and the support plate may be pivoted about an axis defined by the other pair of the support plate pivot bars 344. In some embodiments, the support plate 314 is pivotable between a first or fixed position with the support plate 314 in the cavity C2 and generally parallel to and spaced apart from the housing back wall 318 (e.g., FIG. 22) and a second or rotated position with the support plate 314 partially outside the cavity C2 and generally perpendicular to the housing back wall 318 (e.g., FIG. 27). It will be appreciated that the support plate 314 may be pivoted in an opposite direction to that shown in FIG. 27; that is, the support plate 314 may be pivotably held by the other pair of hinge clips 340 and pivoted about an axis defined by the other pair of support plate pivot bars 344.

Referring to FIG. 29, a plurality of tabs 370 are provided on the opposite face 362 of the hinge clip 340. As illustrated, each tab 370 includes a pair of projections 372. As illustrated in FIG. 20, a plurality of elongated slots 376 and adjacent apertures or openings 378 may be defined in the housing sidewall 322. The hinge clip 340 may be releasably (and reversibly) mounted to the housing 312 such that each tab 370 is received in one of the slots 376 and one of the projections 372 is received in an adjacent opening 378.

The hinge brackets 340 are configured to hold the support plate 314 spaced apart from the back wall 318 of the housing 312 with a major portion of the support plate 314 (e.g., the primary plate portion 314p) generally parallel to the back wall 318. The support plate 314 allows for two layers of components or equipment to be mounted in the housing 312, as described in more detail below.

Figure 30:
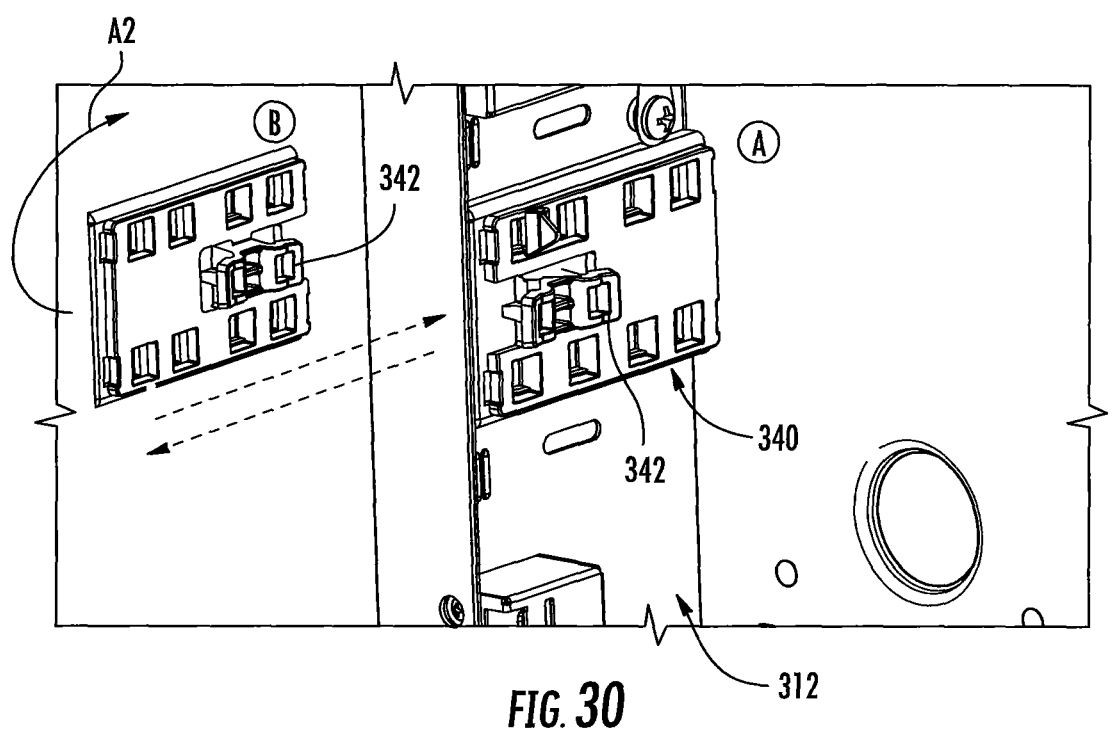
FIG. 30 is a fragmentary perspective view of the housing of FIG. 19 illustrating the hinge clip of FIG. 29 that may be releasably mounted to the housing in first and second configurations according to some embodiments.

Turning to FIG. 30, each hinge clip 340 may be reversible for additional installation options. Each hinge clip 340 may be releasably mounted to the housing 312 in a first configuration A shown in FIG. 30, removed from the housing 312, rotated 180 degrees as shown by the arrow A2 to a second configuration B, and reinserted or releasably mounted to the housing 312 in the second configuration B. With the hinge clips 340 in the first configuration, the support plate 314 may be held in first and second positions in the housing cavity C2 with the plate member 314p generally parallel to and spaced apart a first distance d3 and a second distance d4, respectively, from the housing back wall 318 (FIG. 31A). With the hinge clips 340 in the second configuration, the support plate 314 may be held in third and fourth positions in the housing cavity C2 with the plate member 314p generally parallel to and spaced apart a third distance d5 and a fourth distance d6, respectively, from the housing back wall 318 (FIG. 31B). As illustrated, the first distance d3 is greater than the second distance d4 and the third distance d5 is greater than the fourth distance d6.

It will be appreciated that the configuration of the support plate 314 with the angled tabs 314t allows for the support plate 314 to be mounted at additional different depths in the housing cavity C2. The support plate 314 or the primary plate portion 314p has a first side 315 (FIG. 28) and a second, opposite side 317 (FIG. 27). With the hinge clips 340 in the first configuration, the support plate 314 may be held in the first position described above (FIG. 31A) with the support plate first side 315 facing the back wall 318 of the housing 312. This may also be referred to as the "raised front" position. With the hinge clips 340 also in the first configuration, the support plate 314 may be held in the second position described above with the support plate second side 317 facing the back wall 318 of the housing 312. This second position may also be referred to as the "recessed front" position.

With the hinge clips 340 in the second or "reversed" configuration, the support plate 314 may be held in the third position described above (FIG. 31B) with the support plate first side 315 facing the back wall 318 of the housing 312. This may also be referred to as the "raised rear" position. With the hinge clips 340 also in the second configuration, the support plate 314 may be held in the fourth position described above with the support plate second side 317 facing the back wall 318 of the housing 312. This fourth position may also be referred to as the "recessed rear" position.

As noted above, the support plate 314 allows for two layers of components to be mounted in the housing 312. It will be appreciated that the rear wall 318 of the housing 312 and the support plate 314 effectively provide two relatively large mounting surfaces for mounting components within the housing and/or for enhanced cable management. It will also be appreciated that the pivotable support plate 314 allows for access of components mounted on the "rear layer" or the back wall 318 of the housing 312.

The removable section 352 of the support plate 314 and/or the reversible hinge clips 340 provide further installation flexibility. As noted above, the removable section 352 may be removed to accommodate larger (e.g., deeper) components such as a network music player. Further, the hinge clips 340 may be reversed to provide different layer depths for additional flexibility. For example, the support plate 314 may be held in the second, third or fourth positions shown in FIGS. 31A and 31B to allow for larger components to be mounted to the "front layer" or on the support plate 314 (e.g., to make such components more accessible and/or for improved ventilation). Again, the configuration of the support plate 314 with the angled tabs 314t allow the support plate 314 to be held at four different depths in the housing 312, providing even further installation flexibility.

Moreover, the panel 385p may be removed from the housing 312 to allow a power conditioner to be mounted in the housing 312. The power conditioner can be used to provide power to and protect equipment mounted to the housing back wall 318 and the support plate 314. The drop-in power conditioner takes up very little space in the housing 312, thereby saving space for other devices.

Figure 32A:
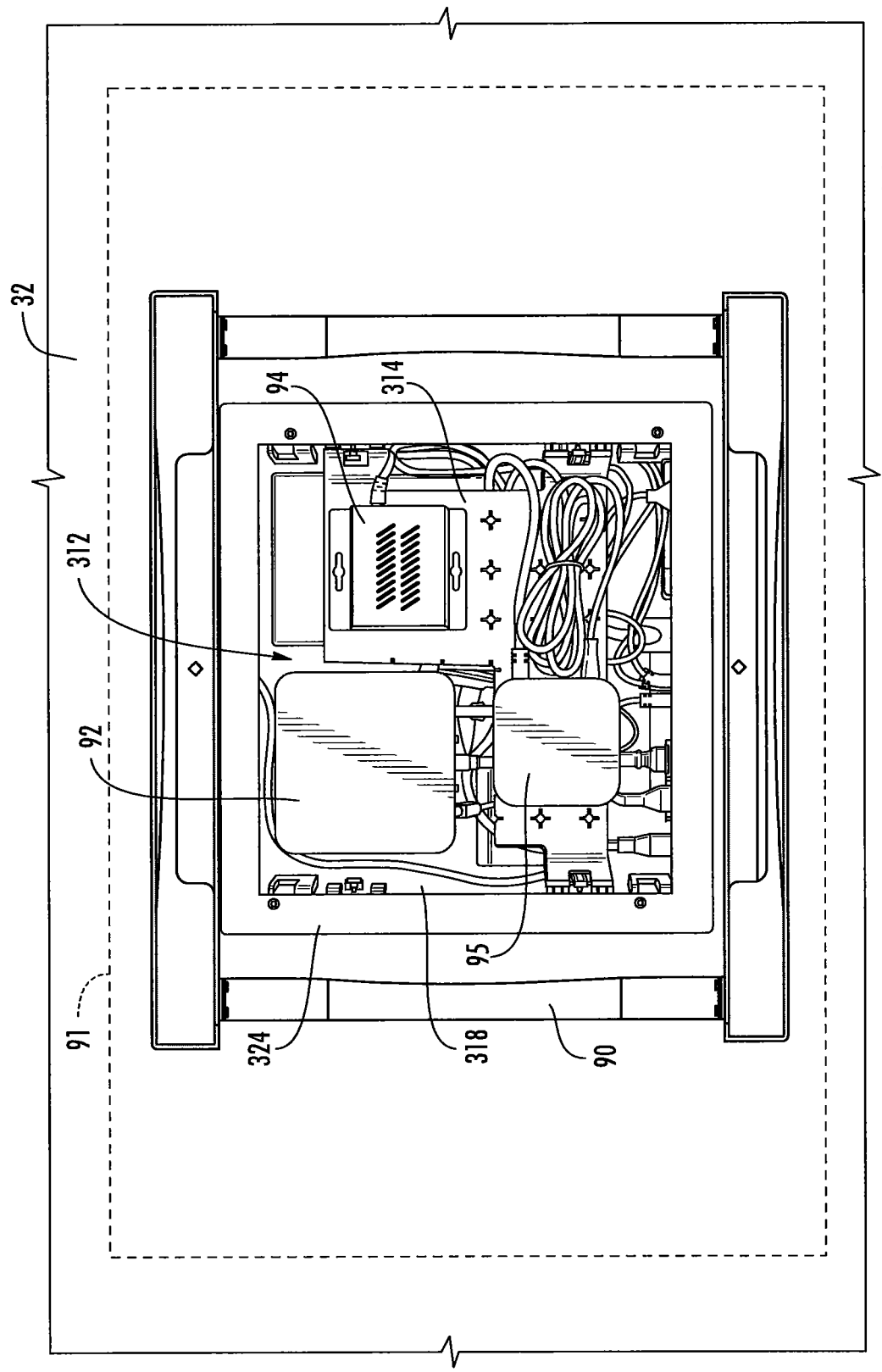
FIG. 32A is a front view of the housing and support plate of FIG. 19, with the housing mounted in a mounting surface and electronic components mounted to the housing and the support plate.
Figure 32B:
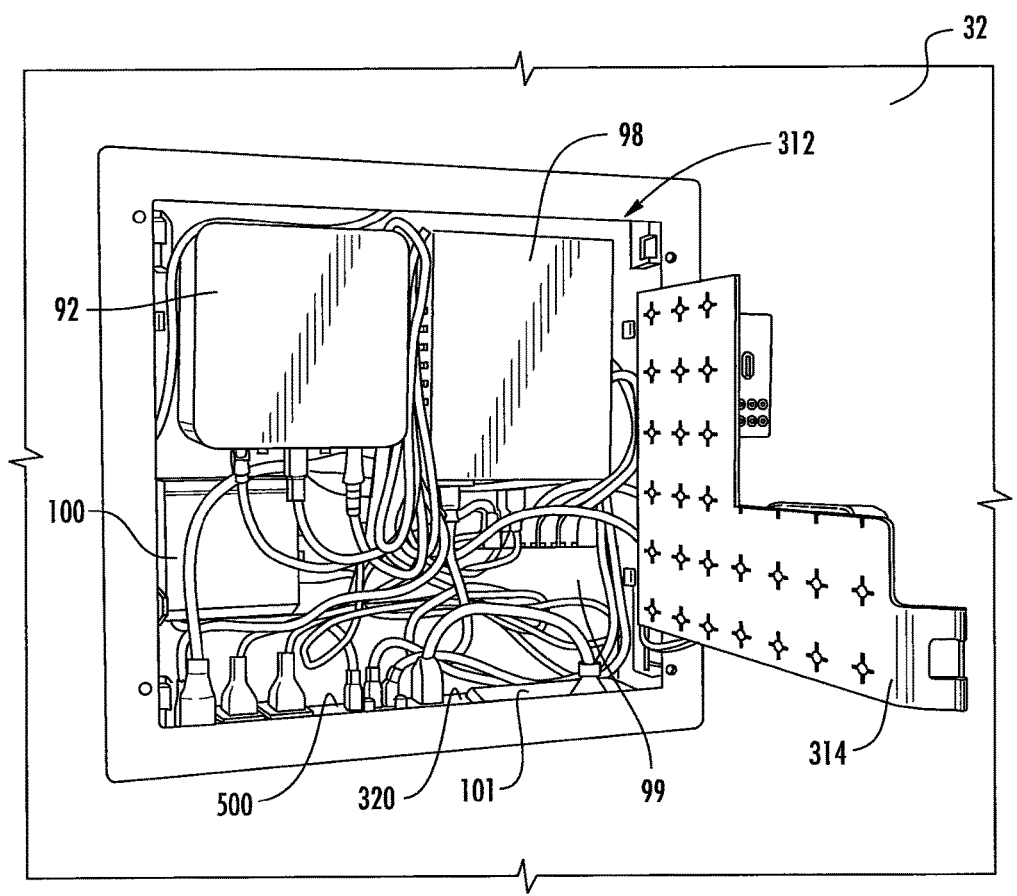
FIG. 32B is a perspective view of the housing and support plate of FIG. 19, with the support plate in a pivoted position and illustrating additional electronic components mounted to a back wall of the housing.

Some of these desirable characteristics are exemplified in FIGS. 32A and 32B. The housing 312 is shown recessed in the mounting surface 32 with the bezel 324 flush against the mounting surface 32. A display mount 90 may be mounted to the mounting surface 32 around the housing 312 and bezel 324. The display mount 90 may be used for mounting a flat panel display 91 in front of the housing 312 and associated components (e.g., the support plate 314, the components mounted to the housing 312 and the support plate 314 and/or the cover 316 which is not shown in FIGS. 32A and 32B). The flat panel display 91 can obscure these components and the recessed nature of the housing 312 allows for low profile mounting of the flat panel display.

As shown in FIG. 32A, the removable section of the support plate 314 has been removed to accommodate a relatively large component 92 such as a network music player (e.g., Sonos®) that is mounted to the back wall 318 of the housing 312. Additional components are shown mounted to the support plate 314, including an audio/video extender receiver 94 and a Smart TV box 95.

In FIG. 32B, the support plate 14 has been pivoted outwardly, thereby exposing additional components mounted to the housing back wall 318 (i.e., the second layer of components). As illustrated, these components include an amplifier 98, a network switch 99 and a wireless subwoofer transmitter 100. Pivoting the support plate 314 allows access to these components, as well as additional access to the components 92, 94, 95 and any associated cables, wires, switches, etc.

In addition, a power conditioner 500 has been dropped in the housing 312 as described above. Also, an outlet box 101 has been installed in the bottom wall 320 of the housing 312. More specifically, the knockout 384k has been removed and the outlet box 101 is received and held in the opening 384 in the housing bottom wall 320 (FIG. 20).

A wide variety of components and equipment may be installed or mounted to the support plate 314 and/or the housing back wall 318. These include additional audio components such as amplifiers, wireless speaker transmitters and distributed audio components (Sonos, etc.) as well as additional video components such as distributed video components (HDMI extenders, etc.), cable or satellite boxes (e.g., DirecTV client box) and Smart TV boxes (Apple TV, Roku, etc.). Network components such as wireless access points, switches and routers may also be installed. Other equipment that may be installed includes control systems or processors (e.g., Pro Control), surveillance components (e.g., analog to digital converters) and cable management equipment. One skilled in the art will appreciate other electronic devices that can be advantageously installed or mounted.

Referring to FIG. 19, the cover 316 is configured to releasably attach or mount to the housing 312 to thereby enclose the components held in the housing 312 and/or provide a pleasing final appearance (which may be particularly desirable when the housing 312 and cover 316 are not obscured by an object such as a flat panel display, for example in ceiling installations). The cover 316 includes a vent 104 which, as illustrated, may include a plurality of spaced-apart apertures. A plurality of recesses 108 are provided to accommodate a user's fingers for attaching and removing the cover 16. The cover 316 may be releasably mounted to or adjacent the front surface 325 of the housing 312 (FIG. 20). For example, referring to FIGS. 19 and 20, the cover 316 may include one or more tabs 316t (e.g., two tabs 316t on each opposite side of the cover 316) that are configured to be received and held in one or more housing slots 390 (e.g., two slots 390 at each housing sidewall 322) to couple the cover 316 to the housing 312.

The cover 316 may be formed of any suitable material. In some embodiments, the cover 316 is metal such as steel.

In some embodiments, the equipment box assembly 300, including the housing 312, the support plate 314 and/or the cover 316, is UL certified. In some embodiments, the equipment box assembly 300, including the housing 312, the support plate 314 and/or the cover 316, is UL 2416 certified.

Figure 34:
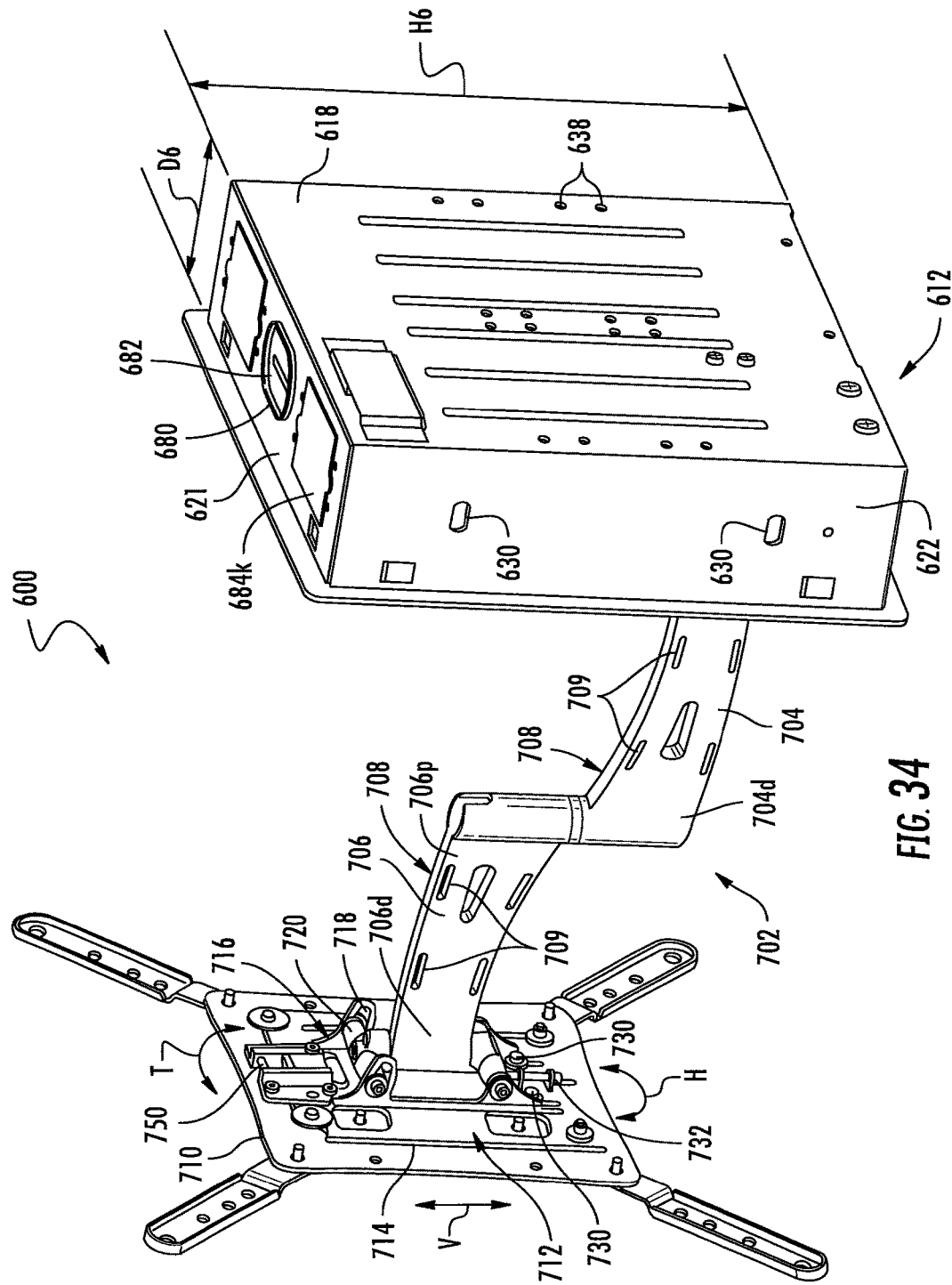
FIG. 34 is a rear perspective view of the equipment box and display mount assembly of FIG. 33.

An equipment box and display mount assembly 600 according to some embodiments is illustrated in FIGS. 33 and 34. The assembly 600 includes a housing 612 and a display mount assembly 700.

The housing 612 includes a back panel or wall 618, a bottom wall 620 and an opposed top wall 621, and a pair of opposed sidewalls 622. A flange 624 extends outwardly from the walls 620, 621, 622. The back wall 618, the bottom wall 620, the top wall 621 and the sidewalls 622 define an open cavity C3 in the housing 612.

As will now be described, the housing 612 includes similar features to the housing 12 of the equipment box assembly 10 and the housing 312 of the equipment box assembly 300. Each sidewall 622 includes a plurality of apertures 630 that are configured to receive fasteners (e.g., a screw or other threaded fastener) that may be advanced into frame members or studs in a similar way as the apertures 330, the fasteners 336 and the studs 34 shown in FIG. 22. The housing 612 may be installed in new work applications and old work applications in a similar way as described for the housing 312 in reference to FIGS. 21 and 22. When installed, a rear portion of the flange 624 may rest flush against a mounting surface such as drywall.

The back wall 618 of the housing 612 also includes a plurality of apertures 638 defined therein. The apertures 638 facilitate mounting of electronic devices and/or wire management in a similar way to described above in reference to the apertures 38 of the housing 12 and the apertures 338 of the housing 312.

The housing 612 may include at least one knockout 684k on the housing bottom wall 620 and/or the housing top wall 621. Like the knockouts 384k of the housing 312, the knockouts 684k are configured to be knocked out or removed to expose an opening for installing components such as a low voltage ring or an outlet box. The top wall 621 may also include at least one cable entry opening or port 680. The cable entry opening 680 on the top wall 621 is shown with a grommet 682 installed therein.

The housing 612 also includes a removable panel 685p that is removably attached to the back wall 618 and the bottom wall 620 of the housing 618. The removable panel 685p is the same or similar to the removable panel 385p associated with the housing 312 described above. In particular, the removable panel 685p may be removed from the housing 612 such that the power conditioner 500 and associated brackets 520, 524 (FIG. 25) may be dropped in and/or mounted to the housing 612. In some embodiments, the equipment box and display mount assembly 600 includes the power conditioner 500.

At least one cable entry port 680 may be on the removable panel 685p. The cable entry port 680 is configured to receive and hold a grommet 682 as illustrated. It will be appreciated that the cable entry openings or ports 680 associated with the housing 612 may be first formed by knocking out cable entry knockouts, such as the knockouts 380k associated with the housing 312 (FIG. 20).

The display mount assembly 700 includes an articulating arm assembly 702. The articulating arm assembly 702 includes a first or lower arm member 704 that is pivotably connected to the housing 612, a second or upper arm member 706 that is pivotably connected to the first arm 704 and a display adapter plate 710 that is connected to or operatively connected to the second arm 706. More specifically, a proximal end portion 704p of the first arm 704 is connected to or operatively connected to the back wall 618 of the housing 612, a distal end portion 704d of the first arm 704 is pivotably connected to a proximal end portion 706p of the second arm 706 and the display adapter plate 710 is connected to or operatively connected to a distal end portion 706d of the second arm 706.

The first and second arms 704, 706 may each include a channel 708 on a top portion and/or a bottom portion of the arm. The first and second arms 704, 706 may also each include a plurality of apertures 709 on the top portion and/or the bottom portion of the arm. The channels 708 and apertures 709 may facilitate cable or wire management. For example, cable or wire may be held in the channel 708 and the apertures 709 may receive zip ties or the like to secure the cable or wire in the channel 708.

In some embodiments, an arm plate assembly 712 is between the second arm 706 and the display adapter plate 710. The arm plate assembly 712 includes an arm plate 714 to which the adapter plate 710 is attached. The arm plate assembly 712 may include a tilt assembly 716. As illustrated, the tilt assembly 716 includes guide paths or slots 718 and followers 720 received in the guide paths 718. The followers 720 are configured to translate within the guide paths 718 such that the display adapter plate 710 and/or a display connected thereto can tilt upwardly and downwardly as indicated by the arrow T.

Figure 37:
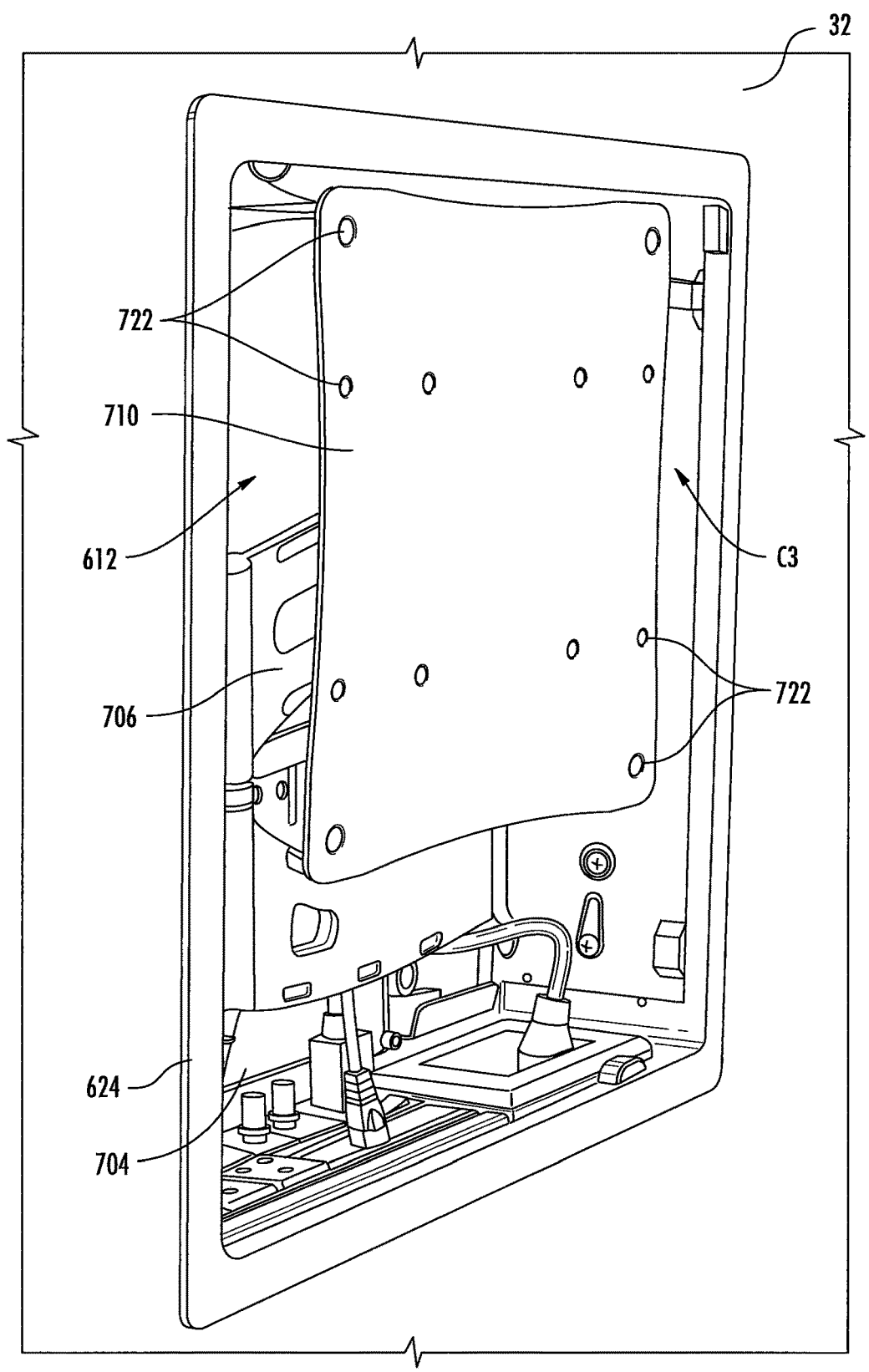
FIG. 37 is a perspective view of the equipment box and display mount assembly of FIG. 33 with the display mount assembly in a fully collapsed position.

Turning to FIG. 37, a plurality of apertures 722 are formed in the adapter plate 710. The apertures 722 may be used for mounting a display to the adapter plate 710. The adapter plate 710 with the apertures 722 may be configured for use with 100×100, 100×200, 200×100 and/or 200×200 VESA patterns. Referring again to FIG. 33, a plurality of adapter arms 724 may be attached to the adapter plate 710. The adapter arms may include a plurality of apertures 726 and may be configured for use with other VESA patterns, such as 400×400 VESA pattern.

In addition to the tilt adjustment described above, the arm plate assembly 712 may include other adjustment features for adjusting the display that has been mounted to the adapter plate 710. For example, referring to FIG. 34, a horizontal level adjustment mechanism 730 may be provided on the arm plate 714. The horizontal level adjustment mechanism 730 may include fasteners that connect the adapter plate 710 and the arm plate 712 (e.g., bolts and/or nuts). The horizontal level adjustment mechanism 730 may be manipulated (e.g., loosened) and the adapter plate 712 and a display mounted thereto may be rotated in the direction indicated by the arrow H such that the display is level (e.g., such that the top and bottom of the display are horizontal). The horizontal level adjustment mechanism 730 may then be further manipulated (e.g., tightened) to secure the display in place.

The arm plate assembly 712 may also include a vertical position adjustment mechanism 732. The vertical position adjustment mechanism 732 may be manipulated to adjust the adapter plate 710 and the display connected thereto in a vertical direction as indicated by the arrow V. For example, the vertical position adjustment mechanism 732 may include a fastener such as a bolt or screw that may be tightened to raise the display and loosened to lower the display.

The display mount assembly 700 is shown in an extended position in FIGS. 33 and 34. The display mount assembly 700 can be collapsed and received in the cavity C3 of the housing 612 as illustrated in FIG. 37. The housing 612 and the display mount assembly 700 include various features to facilitate moving the display mount assembly 700 to the collapsed position and holding the display mount assembly 700 in the collapsed position so that an electronic display device can be positioned very close to the mounting surface or wall.

Referring to FIG. 33, an arm stop member 740 is on the back wall 618 of the housing 612. When the display mount assembly 700 is moved to the collapsed position, the first arm 704 rotates until it abuts the arm stop 740. The arm stop 740 may be block-shaped and may be positioned and sized such that, when the display mount assembly 700 is in the collapsed position, the adapter plate 710 is coplanar or substantially coplanar with the flange 624 of the housing 612 as illustrated in FIG. 37. The arm stop 740 may help prevent the first arm 704 and/or other components of the display mount assembly 700 from striking devices that may be mounted on the back wall 618 of the housing 612.

The arm plate assembly 712 also includes a pin 750 that is spaced apart from a rear surface of the adapter plate 710 (FIG. 34). A latch 752 is on the rear wall 618 of the housing 612 (FIG. 33). The latch 752 is configured to receive the pin 750 when the display mount assembly 700 is moved to the collapsed position and also configured to hold the pin 750 to thereby retain the display mount assembly 700 in the collapsed position. The engagement of the pin 750 and the latch 752 may help prevent the adapter plate 710 and a display mounted thereto from being pushed away from the wall by underlying devices, cables, etc.

Figure 35:
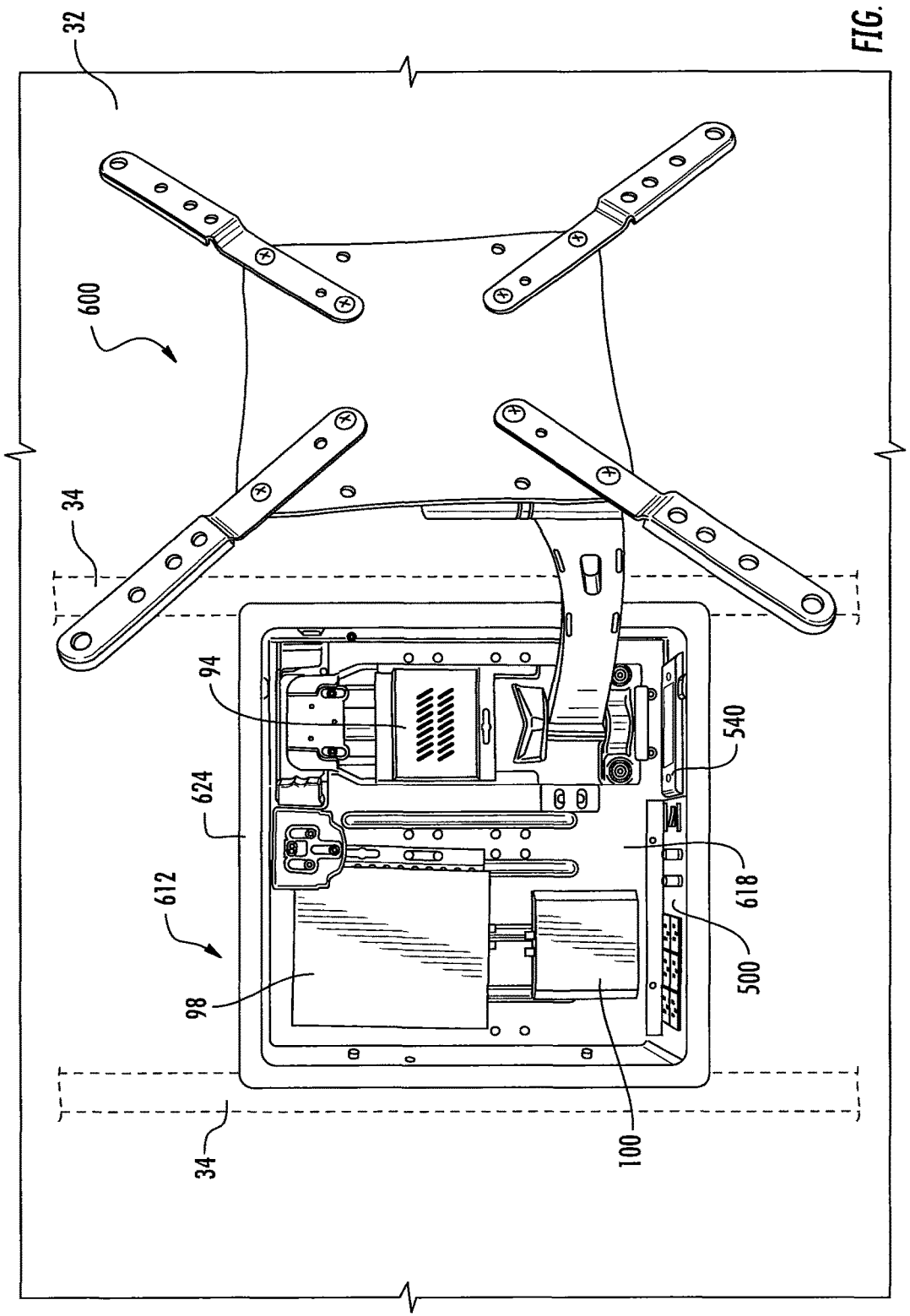
FIG. 35 is a front view of the equipment box and display mount assembly of FIG. 33 mounted in a mounting surface.

FIG. 35 illustrates the equipment box and display mount assembly 700 in an installed position. The housing 612 is secured to studs 34 by fasteners extending through the apertures 630 (FIG. 33). The flange 624 may rest against the mounting surface 32 (e.g., drywall). A plurality of devices are shown mounted in the housing 612. The removable panel 685p (FIG. 33) has been removed and the power conditioner 500 has been dropped in to the housing 612 as described above. The knockout 684k has been removed from the housing bottom wall 620 (FIG. 33) and an outlet box 540 has been mounted in the corresponding opening.

Several devices are mounted to the rear wall 618 of the housing 612 including an audio/video extender receiver 94 and a power conditioner 96, an amplifier 98 and a wireless subwoofer transmitter 100. Other electronic devices described herein may be similarly mounted to the housing back wall 618.

Figure 36:
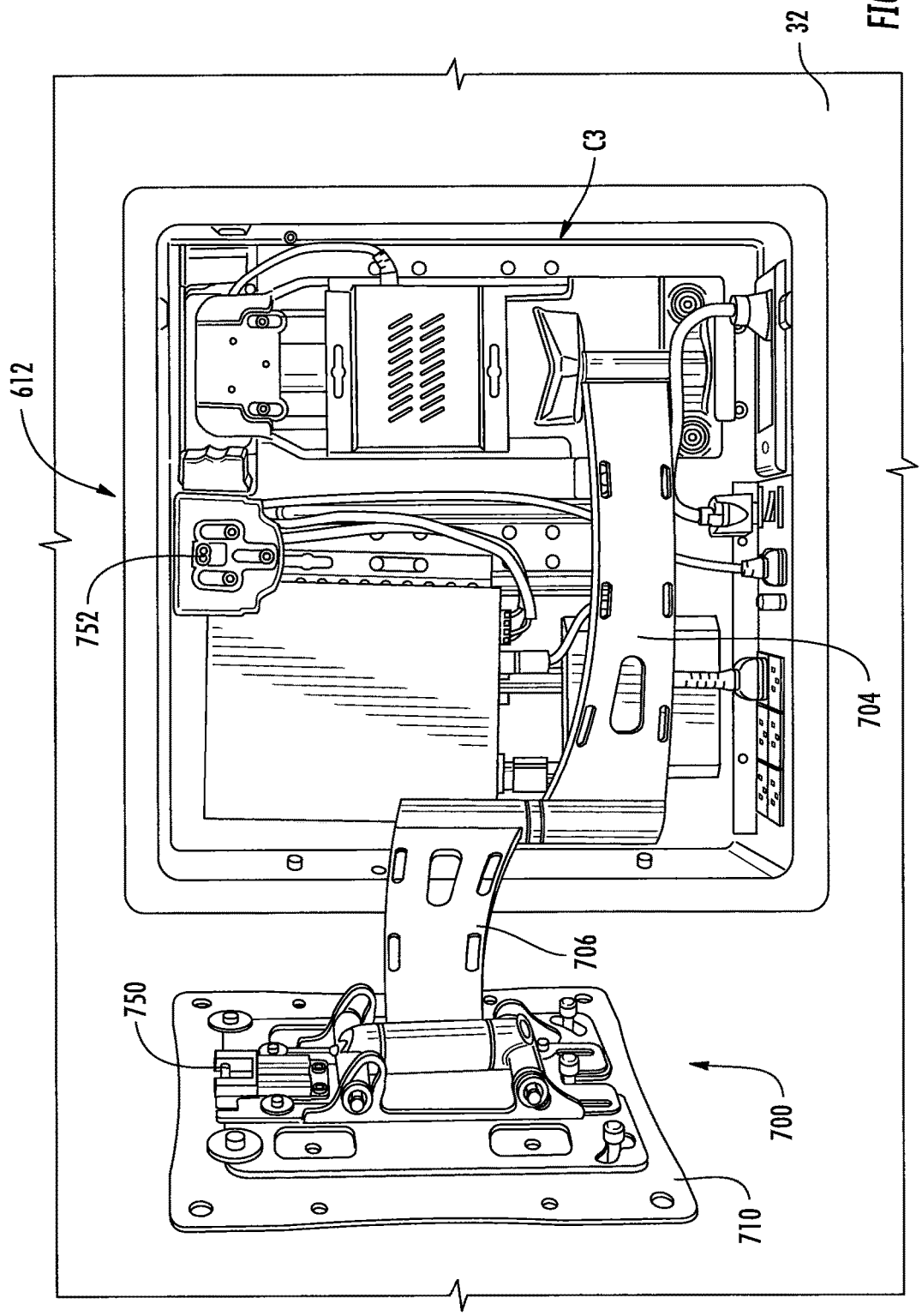
FIG. 36 is a front view of the equipment box and display mount assembly of FIG. 33 with the display mount assembly in a partially collapsed position.

FIG. 36 illustrates the display mount assembly 700 in a partially collapsed position. To reach the partially collapsed position, the first arm 704 is pivoted relative to the housing back wall 618 until the first arm 704 contacts the arm stop 740 (FIG. 33). At this point the first arm 704 is received in the housing cavity C3. In some embodiments, the first arm 704 is parallel or substantially parallel to the housing back wall 618 in the partially collapsed position.

The display mount assembly 700 may be moved from the partially collapsed position shown in FIG. 36 to the fully collapsed position shown in FIG. 37 by pivoting the second arm 706 and the adapter plate 710 (or display device connected thereto) relative to the first arm 704. In the fully collapsed position, the second arm 706 resides above and/or over the first arm 704 and the second arm is also received in the housing cavity C3. In some embodiments, the first arm 704 and/or the second arm 706 is parallel or substantially parallel to the housing back wall 618 in the fully collapsed position.

The pin 750 may be received in and held by the latch 752 in the fully collapsed position. The adapter plate 710 pivots relative to the second arm 706 and may be coplanar or substantially coplanar with the housing flange 624 in the fully collapsed position. In various embodiments, the adapter plate 710 is less than 1 inch, less than 0.5 inches and less than 0.25 inches in front of the housing flange 624 with the display mount assembly 700 in the fully collapsed position.

The above-described configuration allows for a flat panel display connected to the adapter plate 710 to be held very close to the wall 32 (e.g., flush with the wall). Such a low profile appearance is desirable to many end users. The housing 612 may be hidden from view by the flat panel display, and the display may be pulled from the wall when the user wants to use the articulating arm feature and/or wants to access the devices mounted in the housing 612 (e.g., for adjustment or maintenance).

The housing 612 may be generally rectangular or square. Referring to FIGS. 33 and 34, the housing 612 may have a height H6 of between about 12 and 16 inches, between about 13 and 15 inches, and about 14 inches in various embodiments. The housing 612 may have a width W6 of between about 12 and 16 inches, between about 13 and 15 inches, and about 14 inches in various embodiments. The housing 612 may have a depth D6 of between about 2 and 6 inches, between about 3 and 5 inches, and about 4 inches in various embodiments. The housing flange 624 may have a width Wf of between about 0.2 inches and 1 inch, between about 0.4 and 0.8 inches, and about 0.6 inches in various embodiments.

Referring to FIG. 33, the articulating arms 702, 704 extend the adapter plate 710 a distance d7 from the housing flange 624 when the display mount assembly 700 is in the extended position. In some embodiments, the distance d7 is between about 14 and 15 inches.

The housing 612 and the display mount assembly 700 may be formed of any suitable material. In some embodiments, all or substantially all of the components are formed of metal such as steel. In some embodiments, the equipment box and display mount assembly 600 is UL certified.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the teachings and advantages of this invention. Accordingly, all such modifications are intended to be included within the scope of this invention as defined in the claims. The invention is defined by the following claims, with equivalents of the claims to be included therein.

That which is claimed is:

1. An equipment box assembly comprising:
   a housing comprising a back wall, a bottom wall, a top wall, and first and second sidewalls defining a cavity;
   at least one mounting feature on each of the first and second sidewalls; and
   a support plate releasably held in the housing with at least a major portion of the support plate parallel to and spaced apart from the back wall, the support plate comprising a plurality of mounting features for mounting electronic components to the support plate;
   wherein the housing is sized to fit between first and second adjacent studs with the first sidewall mounted to the first stud using the at least one mounting feature on the first sidewall and with the second sidewall mounted to the second stud using the at least one mounting feature on the second sidewall;
   wherein the support plate is configured such that the support plate can be selectively positioned in the housing cavity:
      in a first position with the support plate spaced apart from the back wall a first distance; and
      in a second position with the support plate spaced apart from the back wall a second distance that is less than the first distance.

2. The equipment box assembly of claim 1 wherein the support plate is releasably held in the housing at two locations on the first sidewall and at two locations on the second sidewall.

3. The equipment box assembly of claim 1 further comprising a plurality of apertures in the back wall for mounting electronic components to the back wall.

4. The equipment box assembly of claim 1 further comprising a removable panel on the bottom wall of the housing, the removable panel configured to be removed to expose an opening sized and configured to receive a power conditioner with the power conditioner held at the bottom wall of the housing.

5. The equipment box assembly of claim 4 in combination with a power conditioner comprising a housing having a front surface, wherein a major portion of the power conditioner housing is received through the opening and the power conditioner is held in the housing with the front surface of the power conditioner housing adjacent the bottom wall of the equipment box housing.

6. The combination of claim 5 further comprising at least one bracket on the power conditioner housing and connected to at least one of the back wall and the bottom wall of the equipment box housing.

7. An equipment box assembly comprising:
   a housing comprising a back wall, a bottom wall, a top wall, and first and second sidewalls defining a cavity; and
   at least one mounting feature on each of the first and second sidewalls;
   wherein the housing is sized to fit between first and second adjacent studs with the first sidewall mounted to the first stud using the at least one mounting feature on the first sidewall and with the second sidewall mounted to the second stud using the at least one mounting feature on the second sidewall;
   the equipment box assembly further comprising a display mount assembly connected to the back wall of the housing, the display mount assembly comprising:
   a first articulating arm member operatively connected to the back wall of the housing;
   a second articulating arm member pivotally connected to the first arm member; and
   an adapter plate operatively connected to the second arm member;
   wherein the display mount assembly is movable between an extended position with the adapter plate spaced apart from a front of the housing and a collapsed position with the first and second articulating arm members in the housing cavity and the adapter plate member adjacent the front of the housing.

8. The equipment box assembly of claim 7 wherein the housing comprises a peripheral flange extending outwardly away from the bottom wall, the top wall and the first and second sidewalls, and wherein, with the display mount assembly in the collapsed position, the adapter plate is substantially coplanar with the flange.

9. The equipment box assembly of claim 7 further comprising an arm stop member extending away from the back wall of the housing, wherein the first articulating arm member abuts the arm stop member with the display mount assembly in the collapsed position.

10. The equipment box assembly of claim 7 further comprising a first latch feature on the back wall of the housing and a second latch feature on the display mount assembly, wherein the first and second latch features engage one another with the display mount assembly in the collapsed position and retain the display mount assembly in the collapsed position.

11. An equipment box and power conditioner assembly comprising:
   a housing comprising a back wall, a bottom wall, a top wall, and first and second sidewalls defining a cavity;
   a power conditioner comprising a housing having a front surface;
   an opening in the bottom wall of the housing, wherein the opening and the power conditioner are sized and configured such that the power conditioner can be received through the opening and held at the bottom wall of the housing in an installed position, wherein a major portion of the power conditioner housing extends through the opening and below the bottom wall of the equipment box housing and the front surface of the power conditioner housing is adjacent the bottom wall of the equipment box housing in the installed position;
   at least one mounting feature on each of the first and second sidewalls;
   wherein the housing is sized to fit between first and second adjacent studs with the first sidewall mounted to the first stud using the at least one mounting feature on the first sidewall and with the second sidewall mounted to the second stud using the at least one mounting feature on the second sidewall.

12. The equipment box and power conditioner assembly of claim 11 further comprising a removable panel on the bottom wall of the housing, the removable panel configured to be removed to expose the opening in the bottom wall of the housing.

13. The equipment box and power conditioner assembly of claim 11 wherein the power conditioner comprises a housing having a bottom surface, a top surface and a front surface, the assembly further comprising a first bracket attached to the bottom surface of the housing and a second bracket attached to a top surface of the power conditioner, wherein the first bracket is connectable to one of the back and bottom walls of the equipment box housing and the second bracket is connectable to the other one of the back and bottom walls of the equipment box housing in the installed position.

* * * * *